United States Patent
Choi

(10) Patent No.: US 11,415,740 B2
(45) Date of Patent: Aug. 16, 2022

(54) LIGHTING MODULE, LIGHTING DEVICE, AND MANUFACTURING METHOD THEREOF

(71) Applicant: LG INNOTEK CO., LTD., Seoul (KR)

(72) Inventor: Young Jae Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/415,060

(22) PCT Filed: Dec. 24, 2019

(86) PCT No.: PCT/KR2019/018374
§ 371 (c)(1),
(2) Date: Jun. 17, 2021

(87) PCT Pub. No.: WO2020/138904
PCT Pub. Date: Jul. 2, 2020

(65) Prior Publication Data
US 2022/0066087 A1 Mar. 3, 2022

(30) Foreign Application Priority Data
Dec. 26, 2018 (KR) .......................... 10-2018-0169940

(51) Int. Cl.
*F21V 8/00* (2006.01)
*F21Y 115/10* (2016.01)
*F21S 2/00* (2016.01)

(52) U.S. Cl.
CPC ......... *G02B 6/0065* (2013.01); *G02B 6/0031* (2013.01); *G02B 6/0051* (2013.01);
(Continued)

(58) Field of Classification Search
CPC .... G02B 6/008; G02B 6/0046; G02B 6/0073; G02B 5/02; G02B 6/0078; G02B 6/0088;
(Continued)

(56) References Cited

U.S. PATENT DOCUMENTS 9,097,831 B2 8/2015 Yagi et al.
2001/0053072 A1* 12/2001 Takemoto ......... G02F 1/133606
362/613
(Continued)

FOREIGN PATENT DOCUMENTS

KR 10-2012-0003271 1/2012
KR 10-2013-0055581 5/2013
(Continued)

OTHER PUBLICATIONS

International Search Report dated Apr. 10, 2020 issued in Application No. PCT/KR2019/018374.

*Primary Examiner* — William J Carter
(74) *Attorney, Agent, or Firm* — KED & Associates LLP

(57) ABSTRACT

A lighting device disclosed in an embodiment of the invention includes a substrate; a light source including a plurality of light emitting devices disposed on the substrate; a resin layer disposed on the substrate; and a first diffusion layer disposed on the resin layer, wherein the resin layer includes a first resin portion disposed on the light source, and a second resin portion adjacent to the first resin portion and disposed on the substrate. The upper surface of the first resin portion has an inclination and is spaced apart from the first diffusion layer, the second resin portion includes a material different from that of the first resin portion, and the second resin portion based on the upper surface of the substrate. The height of the upper surface may be greater than the lowermost height of the upper surface of the first resin portion.

18 Claims, 12 Drawing Sheets

(52) U.S. Cl.
CPC ......... *G02B 6/0068* (2013.01); *G02B 6/0073* (2013.01); *F21S 2/005* (2013.01); *F21Y 2115/10* (2016.08)

(58) Field of Classification Search
CPC ...... G02B 6/0035; G02B 6/0043; G02B 6/00; G02B 6/002; G02B 6/0045; G02B 6/0076
See application file for complete search history.

(56) References Cited

U.S. PATENT DOCUMENTS

| | | |
|---|---|---|
| 2011/0050558 A1* | 3/2011 | Park .................. G02F 1/133603 345/102 |
| 2011/0090423 A1 | 4/2011 | Wheatley |
| 2015/0055371 A1* | 2/2015 | van de Ven .......... G02B 6/0078 362/612 |
| 2019/0137046 A1 | 5/2019 | Hwang et al. |

FOREIGN PATENT DOCUMENTS

| | | |
|---|---|---|
| KR | 10-2018-0119539 | 11/2018 |
| WO | WO 2017/191954 | 11/2017 |

* cited by examiner

LIGHTING MODULE, LIGHTING DEVICE, AND MANUFACTURING METHOD THEREOF

CROSS-REFERENCE TO RELATED PATENT APPLICATIONS

This application is a U.S. National Stage Application under 35 U.S.C. § 371 of PCT Application No. PCT/KR2019/018374, filed Dec. 24, 2019, which claims priority to Korean Patent Application No. 10-2018-0169940, filed Dec. 26, 2018, whose entire disclosures are hereby incorporated by reference.

TECHNICAL FIELD

An embodiment relates to a lighting module and a lighting device having a light emitting device, and a method of manufacturing the same. The embodiment relates to a backlight unit having a lighting module, a liquid crystal display device, or a vehicle lamp.

BACKGROUND ART

Lighting applications include vehicle lights as well as backlights for displays and signs. Light emitting device, such as light emitting diode (LED), have advantages such as low power consumption, semi-permanent life, fast response speed, safety, and environmental friendliness compared to conventional light sources such as fluorescent lamps and incandescent lamps. These light emitting diodes are applied to various display devices, various lighting devices such as indoor or outdoor lights. Recently, as a vehicle light source, a lamp employing a light emitting diode has been proposed. Compared with incandescent lamps, light emitting diodes are advantageous in that power consumption is small. However, since an emission angle of light emitted from the light emitting diode is small, when the light emitting diode is used as a vehicle lamp, there is a demand for increasing the light emitting area of the lamp using the light emitting diode. Since the light emitting diode is small, it may increase the design freedom of the lamp, and it is economical due to its semi-permanent life.

DISCLOSURE

Technical Problem

An embodiment of the invention may provide a lighting module or lighting device having a resin layer having resin portions of different materials between a substrate and a diffusion layer and a light source sealed with one of the resin portions of the resin layer. The resin layer according to an embodiment of the invention includes a first resin portion on a light source and a second resin portion spaced apart from the first resin portion, or includes a first resin portion formed of silicon material covering the light source and a second resin portion formed of a UV resin material in front of the first resin portion. An embodiment of the invention provides a lighting module and a lighting device in which an air region is provided between a first resin portion covering a light source and a diffusion layer, and an adhesive layer is disposed between a second resin portion and the diffusion layer. An embodiment of the invention may provide a lighting module and a lighting device in which an air region and a light shielding portion are disposed on a first resin portion covering a light source, and an adhesive layer is disposed on a second resin portion spaced apart from the first resin portion. An embodiment of the invention provides a lighting module and a lighting device in which an adhesive layer and a light shielding portion are disposed between a plurality of diffusion layers, and an air region and a resin layer having resin portions of different materials are disposed between the plurality of diffusion layers and a substrate. An embodiment of the invention provides a lighting module and a lighting device in which a reflective member is disposed between a resin layer and a substrate. An embodiment of the invention provides a lighting module or lighting device for irradiating a surface light source, and a method of manufacturing the same. An embodiment of the invention may provide a backlight unit having a lighting module, a liquid crystal display device, or a vehicle lamp.

Technical Solution

A lighting device according to an embodiment of the invention includes a substrate; a light source including a plurality of light emitting devices disposed on the substrate; a resin layer disposed on the substrate; and a first diffusion layer disposed on the resin layer, wherein the resin layer includes a first resin portion disposed on the light source and a second resin portion adjacent to the first resin portion and disposed on the substrate, wherein an upper surface of the first resin portion has an inclination and is spaced apart from the first diffusion layer, the second resin portion includes a material different from that of the first resin portion, and a height of the upper surface of the second resin portion with respect to an upper surface of the substrate may be higher than a height of the lowermost end of the upper surface of the first resin portion. A lighting device according to an embodiment of the invention includes a substrate; a light source disposed on the substrate; a resin layer disposed on the substrate; and a first diffusion layer disposed on the resin layer, wherein the light source includes a first light emitting device and a second light emitting device spaced apart from the first light emitting device, and the resin layer comprises a plurality of first resin portions disposed on the first light emitting device and the the second light emitting device, and a second resin portion disposed between the first light emitting device and the second light emitting device, and upper surfaces of the plurality of first resin portions is spaced apart from the first diffusion layer, wherein a height of the upper surface of the second resin portion with respect to an upper surface of the substrate may be higher than a height of the upper surface of the first resin portion with overlapping the first light emitting device in a vertical direction on the upper surface of the substrate. A method of manufacturing a lighting device according to an embodiment of the invention includes: disposing a light source having a plurality of light emitting devices on a substrate; forming a first resin portion on a front surface of each of the plurality of light emitting devices; forming a second resin portion outside the first resin portion; disposing a first adhesive layer on the second resin portion; and bonding the second resin portion and the first diffusion layer by the first adhesive layer, wherein the first resin portion and the second resin portion comprise different materials, and the first diffusion layer and the first resin portion may be disposed to be spaced apart from each other.

According to an embodiment of the invention, the light source includes a first light emitting device and a second light emitting device spaced apart from the first light emitting device, and the second resin portion may be disposed between the first light emitting device and the second light emitting device. The first resin portions may be disposed in a plurality, and the second resin portion may be disposed between the plurality of first resin portions. Each of the plurality of first resin portions may cover at least one light emitting device. The light emitting devices are arranged on the substrate in N rows and M columns, and the M and the N are integers of 1 or more, and have a relationship of N≥M, and the first resin portion and the second resin portion may be alternately disposed in a row direction. The first resin portions may be spaced apart from each other in a column direction or may be integrally formed. The resin layer includes a first side surface and a second side surface disposed opposite to each other, the first light emitting device is adjacent to the first side surface, the second light emitting device is adjacent to the second side surface, and the second resin portion may be disposed between the first light emitting device adjacent to the first side surface of the resin layer and the second light emitting device adjacent to the second side surface. A height of the uppermost end of the second resin portion may be higher than or equal to a height of the uppermost end of the upper surface of the first resin portion. The second resin portion and the first diffusion layer may be adhered to each other by a first adhesive layer. A light shielding portion may be disposed on the first resin portion, and an upper surface of the second resin portion may not overlap the light shielding portion in a vertical direction. A second diffusion layer is disposed on the first diffusion layer; and a second adhesive layer is disposed between the first diffusion layer and the second diffusion layer, wherein the light shielding portion is disposed between the first diffusion layer and the second diffusion layer, and overlaps in a direction perpendicular to the first resin portion. The second adhesive layer and the first adhesive layer may overlap in a vertical direction. The first adhesive layer may not overlap in a direction perpendicular to the first resin portion. The plurality of first resin portions may be disposed to be spaced apart from each other. The upper surface of the first resin portion may include a region that increases as a distance from the light source increases with respect to the upper surface of the substrate. The upper surface of the first resin portion may include a plurality of concave portions and convex portions. The first resin portion may include a silicone resin or a thermosetting resin, and the second resin portion may include a UV resin. A region spaced apart between the first resin portion and the first diffusion layer may be an air region. The horizontal length of the first resin portion and the second resin portion disposed between the first light emitting device and the second light emitting device may include a ratio of 4:6 to 6:4.

Advantageous Effects

According to the invention, it is possible to reduce discoloration due to UV resin on a front surface of the light source. In addition, since the second resin portion of the ultra violet (UV) resin is disposed between the first resin portions covering each of the light sources, an effect of the UV resin on an emission surface of the light source may be blocked. In addition, by providing a resin layer having a first resin portion covering the light source and a second resin portion disposed between the light sources, it is possible to prevent deterioration of electrical and optical properties in a high temperature and high humidity environment. Hot spots may be suppressed by disposing an air region and a light shielding portion on the first resin portion covering the light source. Since the second resin portion is disposed between the first resin portion covering the light source, an adhesion of the adhesive layer bonded between the diffusion layer and the second resin portion may be improved.

According to an embodiment of the invention, it is possible to improve the light intensity and light uniformity of the surface light source. Since a reflective member is disposed between the resin layer and the substrate, light reflection efficiency may be improved. Therefore, it is possible to improve the optical reliability of the lighting module and the lighting device having the same. In addition, reliability of a vehicle lighting device having a lighting module or device may be improved, and the lighting module or lighting device may be applied to a backlight unit, various display devices, a surface light source lighting device, or a vehicle lamp.

BEST MODE

Figure 1:
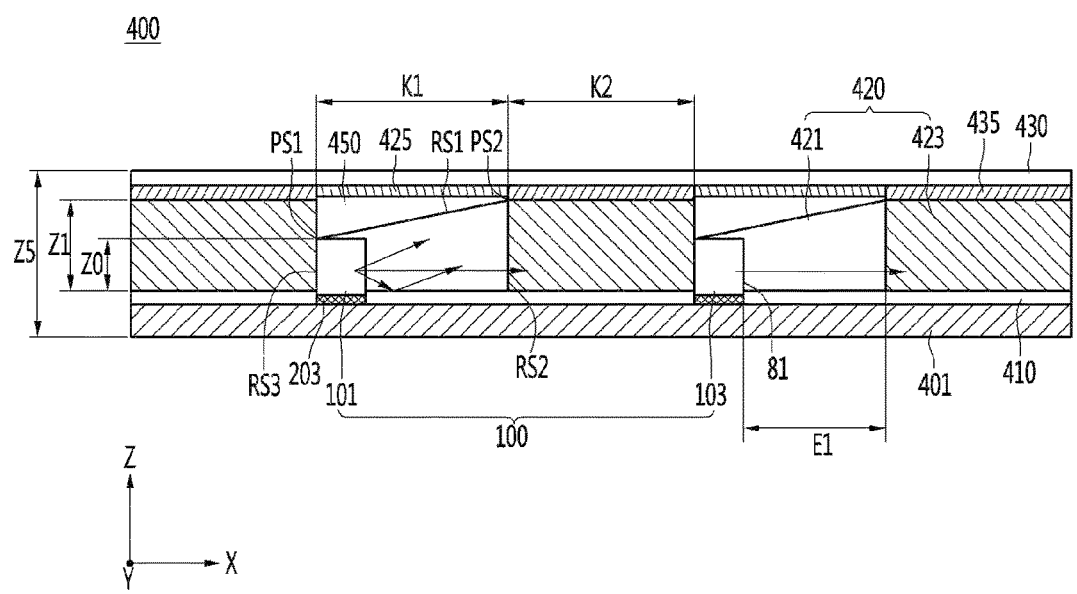
FIG. 1 is a cross-sectional view showing an example of a lighting device according to a first embodiment.

A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to a variety of lamp devices that require lighting, such as vehicle lamps, home lighting devices, or industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that are currently developed and commercialized or that may be implemented according to future technological developments.

Referring to FIGS. 1 to 7, a lighting device 400 according to an embodiment of the invention includes a substrate 401, a light source 100 disposed on the substrate 401, and a resin layer covering the light source 100, and a first diffusion layer 430 on the resin layer 420. The lighting device 400 may include a reflective member 410 disposed on the substrate 401. The lighting device 400 according to an embodiment of the invention may emit light emitted from the light source 100 to a surface light source. The lighting device 400 may include a plurality of light sources on at least one of an upper surface and a lower surface of the substrate 401.

The light source 100 includes a plurality of light emitting devices 101 and 103, and the plurality of light emitting devices 101 and 103 may be arranged in N rows and M columns (N and M are integers of 1 or more, and N≥M). The resin layer 420 may be disposed between the substrate 401 and the first diffusion layer 430. The resin layer 420 and the light source 100 may be disposed between the substrate 401 and the first diffusion layer 430. The light emitting devices 101 and 103 of the light source 100 may irradiate light in the same direction or in different directions or in opposite directions. The resin layer 420 may disposed of different resin materials between the light emitting devices 101 and 103. The resin layer 420 guides and diffuses the light emitted from the light source 100 and emits a surface light source through the surface. In the resin layer 420, resin portions 421 and 423 of different materials may be alternately arranged in a horizontal direction, and any one resin portion may be disposed between different resin portions covering the light emitting devices 101 and 103, respectively. In the resin layer 420, different members may be disposed on the resin portions 421 and 423 of different materials. In the resin layer 420, upper surfaces of the resin portions 421 and 423 of different materials may be disposed on different planes. For the following description, in each drawing, the outer surfaces of the substrate 401 and the resin layer 420 are shown as first to fourth outer surfaces S1, S2, S3 and S4, and the first outer surface S1 is a one side of the substrate 401 and the resin layer 420, the second outer side S2 is a side facing the first outer side S1, the third and fourth outer side S3 and S4 are disposed between both ends of the first and second outer surfaces S1 and S2 and may be surfaces facing each other. The first and second outer surfaces S1 and S2 extend with a long length in the second direction, and the third and fourth outer surfaces S3 and S4 may extend with a long length in the first direction. The lighting device 400 may be a module to which a surface light source is irradiated, and may be provided with a thickness Z5 of 3.5 mm or less, for example, 3 mm or less, or 2.3 mm to 3 mm. Since the lighting device 400 has the above thickness Z5, it may be provided with a flat horizontal surface or a flexible curved surface.

Referring to FIGS. 1 to 4, the substrate 401 may include a printed circuit board (PCB) having a circuit pattern. The substrate 401 may include, for example, at least one of a resin-based printed circuit board (PCB), a metal core PCB, a flexible PCB, a ceramic PCB, or an FR-4 substrate. When the substrate 401 is disposed as a metal core PCB in which a metal layer is disposed on a bottom thereof, heat dissipation efficiency of the light source 100 may be improved. The substrate 401 may be electrically connected to the light source 100. The substrate 401 includes a wiring layer (not shown) having a circuit pattern thereon, and the wiring layer may be electrically connected to each of the light emitting devices 101 and 103. When the light emitting devices 101 and 103 are arranged in plural on the substrate 401, the plurality of light emitting devices 101 and 103 may be connected in series, parallel, or in series-parallel by the wiring layer. The substrate 401 may function as a base member or a support member disposed under the light emitting devices 101 and 103 and the resin layer 420. The upper surface of the substrate 401 may have an X-Y plane. The upper surface of the substrate 401 may have a flat or curved surface. The thickness of the substrate 401 may be a height in a vertical direction or a Z direction. Here, the X direction may be a first direction, and the Y direction may be a second direction. The Z direction may be a direction orthogonal to the first and second directions. The length of the substrate 401 in the first direction may be greater than the width of the second direction. The length of the substrate 401 in the first direction may be twice or more, for example, 4 times or more than a width (Y1, see FIG. 4) of the second direction. The plurality of light emitting devices 101 and 103 may be arranged on the substrate 401 with predetermined intervals in the first direction. The substrate 401 may include a light-transmitting material through which light is transmitted through an upper surface and a lower surface. The translucent material may include at least one of polyethylene terephthalate (PET), polystyrene (PS), and polyimide (PI).

Figure 20:
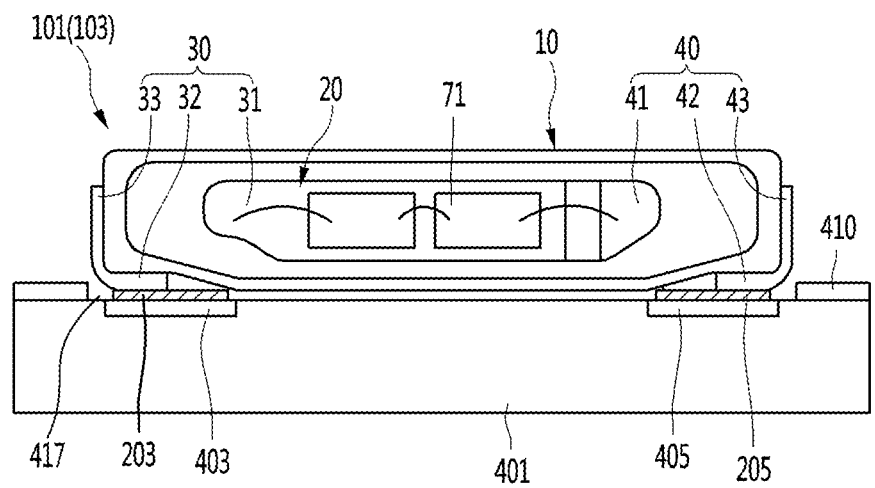
FIG. 20 is a front view of a light emitting device of a light source in the lighting device of FIG. 1.
Figure 21:
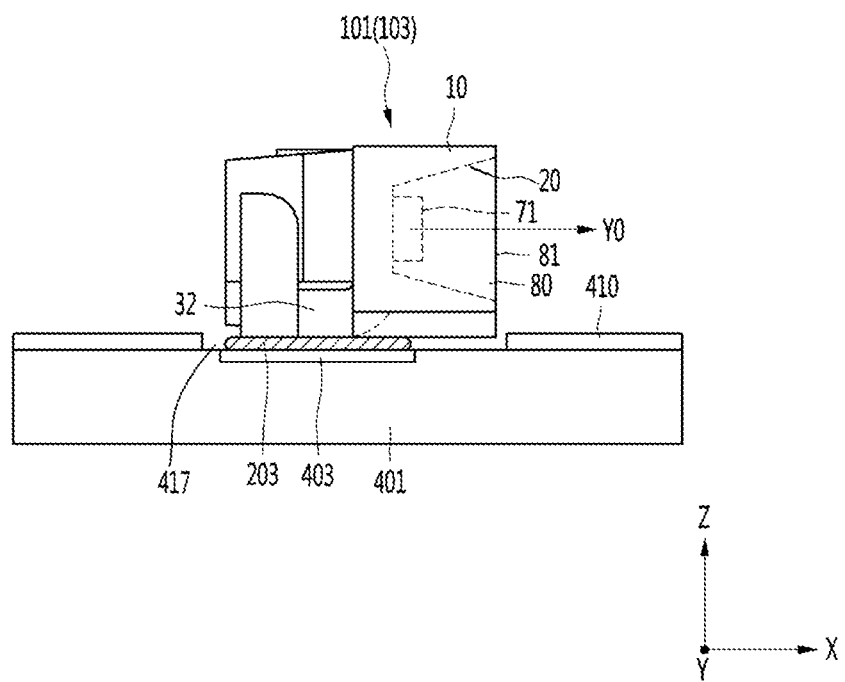
FIG. 21 is an example of a side cross-sectional view of a light source at the lighting device of FIG. 20.

The light source 100 may include a plurality of light emitting devices 101 and 103 arranged in at least the first direction X. The light source 100 may include at least one third light emitting device arranged in the second direction Y. That is, the light source 100 may include light emitting devices in N rows and M columns. For the convenience of explanation, the light emitting device will be described by taking the first light emitting device 101 and the second light emitting device 103 spaced apart in the first direction as an example. The first light emitting device 101 is disposed adjacent to the first outer surface S1 of the resin layer 420 and emits light toward the second outer surface S2. The second light emitting device 103 is adjacent to the second outer surface S2 within the resin layer 420 or is spaced apart from the first light emitting device 101 in the first direction X, and emits light toward the second outer surface S2. Each of the light emitting devices 101 and 103 is disposed on the substrate 401 and emits light in the first direction or in a direction of the second outer surface S2. The light emitting devices 101 and 103 emit light having the highest intensity in the first direction. The light emitting devices 101 and 103 may have an emission surface 81 through which light is emitted, and the emission surface 81 may be disposed, for example, in a third direction or a vertical direction with respect to a horizontal upper surface of the substrate 401. The emission surface 81 may be a surface of the molding member 80 in the light emitting devices 101 and 103, may be a vertical plane, or may include a concave or convex surface toward a LED chip 71. As shown in FIGS. 20 and 21, the light emitting devices 101 and 103 may be disposed on the substrate 401 and electrically connected to the pads 403 and 405 of the substrate 401 by conductive bonding members 203 and 205. The conductive bonding members 203 and 205 may be made of a solder material or a metal material. As another example, the light emitting devices 101 and 103 may be arranged in one row or two or more rows in the second direction on the substrate 401, and the light emitting devices 101 and 103 in the first row or two or more rows are the substrate may emit light in a direction of the second side surface of 401, or may emit the light in the same direction or in different directions. The light emitting devices 101 and 103 are devices having a light emitting diode (LED) chip, and may include a package in which the light emitting diode chip is packaged. The light emitting diode chip 71 may emit at least one of blue, red, green, ultraviolet (UV), and infrared rays. The light emitting diode chip may emit blue light, for example, a wavelength having the highest intensity in a range of 400 nm to 500 nm or a wavelength of 400 nm to 470 nm. A molding member 80 is disposed in the light emitting devices 101 and 103, and the molding member 80 may include a wavelength converting means. The wavelength conversion means includes a phosphor or quantum dot, and may emit light with a wavelength having the highest intensity in blue, green, yellow, or red wavelengths. Accordingly, wavelengths having the highest intensity of light emitted from the light emitting devices 101 and 103 are emitted and may be mixed with each other. The light emitting devices 101 and 103 may emit white, blue, yellow, green, or red light. As another example, the light emitting devices 101 and 103 may be disposed as an LED chip. The light emitting devices 101 and 103 may be of a side view type in which a bottom portion thereof is electrically connected to the substrate 401. As another example, the light emitting devices 101 and 103 may be disposed as an LED chip. The emission surfaces 81 of the light emitting devices 101 and 103 are disposed on one side, and the emission surface 81 may be a side adjacent to the upper surface of the substrate 401. The emission surface 81 is disposed on a side surface between the bottom surface and the upper surface of the light emitting devices 101 and 103, and emits light having the highest intensity in the first direction. The emission surface 81 of the light emitting devices 101 and 103 may be a surface adjacent to the reflective member 410 or may be a surface perpendicular to the upper surface of the substrate 401 and the upper surface of the reflective member 410. The light emitted through the emission surfaces 81 of the light emitting devices 101 and 103 travels in a direction parallel to the upper surface of the substrate 401, is reflected by the reflective member 410, or may travel toward the upper surface of the resin layer 420. The thickness of the light emitting devices 101 and 103 may be, for example, 3 mm or less, for example, in the range of 0.8 mm to 2 mm. The length (D1 in FIG. 4) of the light emitting devices 101 and 103 in the second direction may be 1.5 times or more of the thickness of the light emitting devices 101 and 103. The light emitting devices 101 and 103 may have a wider light directivity angle in a ±Y direction than the light directivity angle in a ±Z direction. The light directivity angle of the light emitting devices 101 and 103 in the second direction may be 110 degrees or more, for example, 120 degrees to 160 degrees, or 140 degrees or more. The light directivity angle of the light emitting devices 101 and 103 in the third direction may have a range of 110 degrees or more, for example, 120 degrees to 140 degrees.

The reflective member 410 may be disposed between the substrate 401 and the resin layer 420. The reflective member 410 may be provided in a form of a film having a metallic material or a non-metallic material. The reflective member 410 may be adhered to the upper surface of the substrate 401. The reflective member 410 may have an area smaller than an area of an upper surface of the substrate 401. The reflective member 410 may be spaced apart from an edge of the substrate 401, and a resin layer 420 may be attached to the substrate 401 in the spaced region. In this case, it is possible to prevent the edge portion of the reflective member 410 from peeling off. The reflective member 410 may include an opening 417 in which the lower portions of the light emitting devices 101 and 103 are disposed. In the opening 417 of the reflective member 410, an upper surface of the substrate 401 is exposed in the opening 417 and a portion to which the lower portions of the light emitting devices 101 and 103 are bonded may be disposed in the opening 417. The size of the opening 417 may be equal to or larger than the size of the light emitting devices 101 and 103. The reflective member 410 may be in contact with the upper surface of the substrate 401 or may be bonded between the resin layer 420 and the substrate 401. Here, when a reflective layer made of a highly reflective material is disposed on the upper surface of the substrate 401, the reflective member 410 may be removed. The reflective member 410 may be formed to have a thickness thinner than that of the light emitting devices 101 and 103. The thickness of the reflective member 410 may include a range of 0.2 mm±0.02 mm. The lower portions of the light emitting devices 101 and 103 may pass through the opening 417 of the reflective member 410 and the upper portions of the light emitting devices 101 and 103 may protrude. The emission surfaces 81 of the light emitting devices 101 and 103 may be provided in a direction perpendicular to the upper surface of the reflective member 410.

The reflective member 410 may include a metallic material or a non-metallic material. The metallic material may include metals such as aluminum, silver, and gold. The non-metallic material may include a plastic material or a resin material. The plastic material may be any one selected from the group consisting of polyethylene, polypropylene, polystyrene, polyvinyl chloride, polychloride biphenyl, polyethylene terephthalate, polyvinyl alcohol, polycarbonate, polybutylene terephthalate, polyethylene naphthalate, polyamide, polyacetal, polyphenylene, polyamideimide, polyetherimide, polyetheretherketone, polyimide, polytetrafluoroethylene, liquid crystal polymer, fluororesin, copolymers thereof, and mixtures thereof. As the resin material, a reflective material such as $TiO_2$, $Al_2O_3$, or $SiO_2$ may be added to silicon or epoxy. The reflective member 410 may be implemented as a single layer or multiple layers, and light reflection efficiency may be improved by such a layer structure. The reflective member 410 according to the embodiment of the invention reflects incident light, thereby increasing the amount of light so that the light is uniformly distributed.

Figure 8:
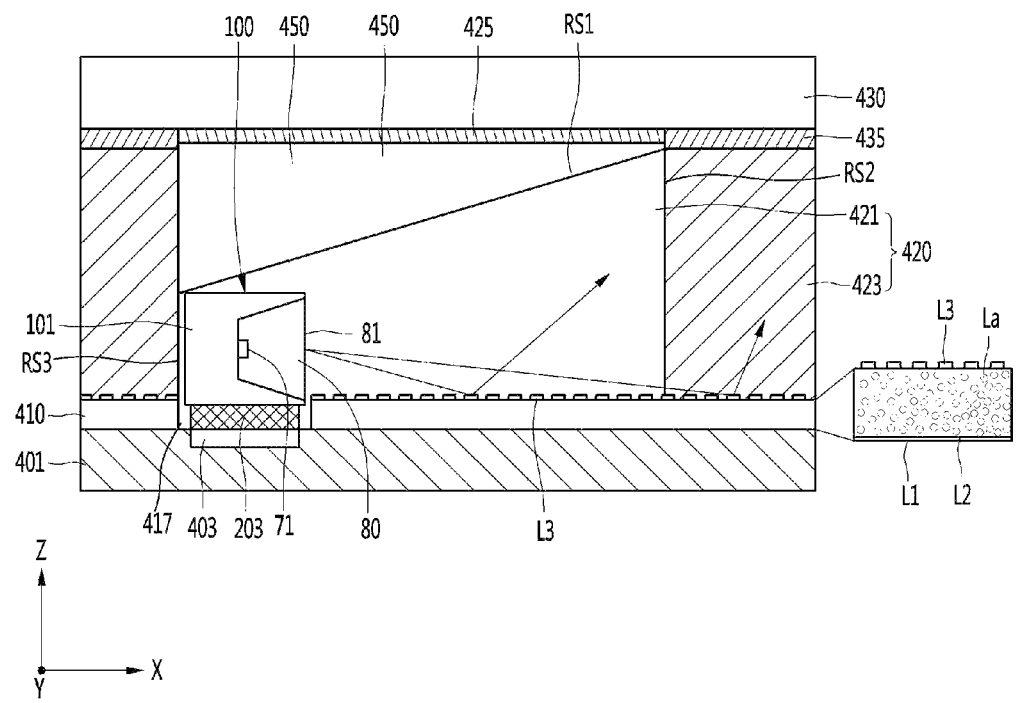
FIG. 8 is an example of a reflective member in the lighting device of FIG. 2.

Referring to FIG. 8, the reflective member 410 may include an adhesive layer L1, a reflective layer L2, and a dot portion L3. The adhesive layer L1 may attach the reflective member 410 to the upper surface of the substrate 401. The adhesive layer L1 is a transparent material, and may be an adhesive such as UV adhesive, silicone, or epoxy. The reflective layer L2 may include a plurality of reflective agent La in a resin material. The reflective agent La may be a bubble such as air, or may be a medium having a refractive index of the same medium as air. The resin material of the reflective layer L2 is a material such as silicon or epoxy, and the reflective agent La may be formed by injecting bubbles into the resin material. The reflective layer L2 may reflect light incident by the plurality of reflective agent La or may refract it in different directions. The thickness of the reflective layer L2 may be 80% or more of the thickness of the reflective member 410. A dot portion L3 in which a plurality of dots are arranged on the reflective layer L2 may be included. The dot portion L3 may be formed on the reflective layer L2 through printing. The dot portion L3 may include reflective ink, and may be printed with a material including any one of $TiO_2$, $CaCO_3$, $BaSO_4$, $Al_2O_3$, Silicon, and PS. Each dot of the dot portion L3 may have a hemispherical shape or a polygonal shape in a side cross section. The density of a dot pattern of the dot portion L3 may increase as the distance from the emission surface 81 of the light emitting devices 101 and 103 increases. The material of the dot portion L3 may be white. Since the dot portion L3 is disposed on the upper surface of the reflective member 410 in the emission direction of the light emitting devices 101 and 103, it is possible to improve light reflectance, reduce light loss, and improve luminance of a surface light source. The density of the dot portions L3 may be arranged at uniform intervals or may increase as the distance from the emission surface 81 of the light emitting devices 101 and 103 increases.

Figure 2:
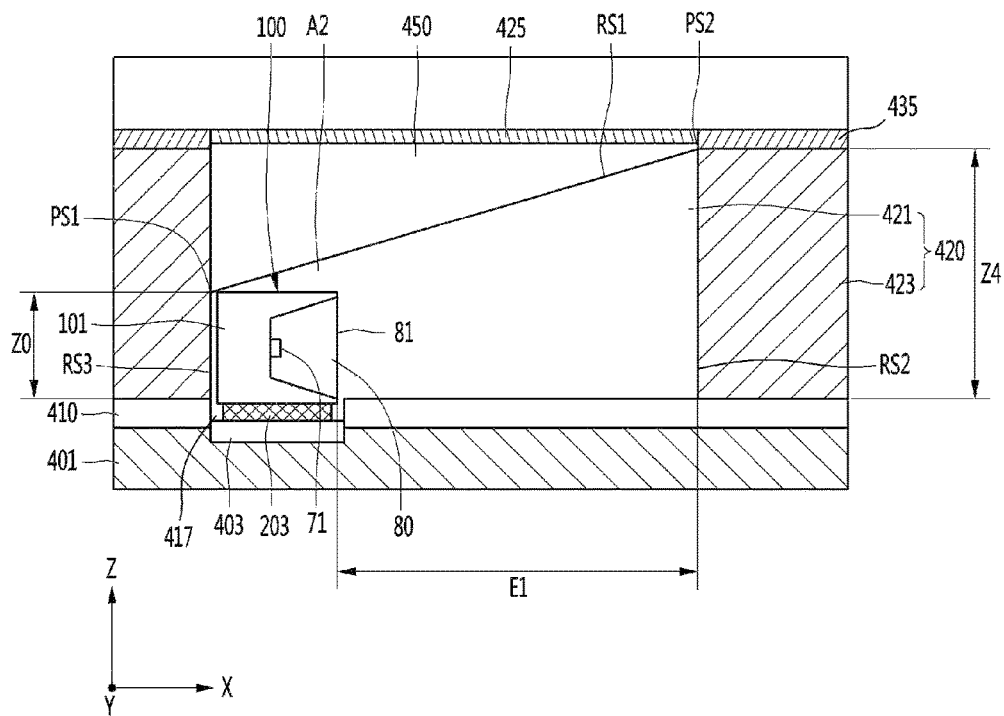
FIG. 2 is a partially enlarged view of the lighting device of FIG. 1.
Figure 3:
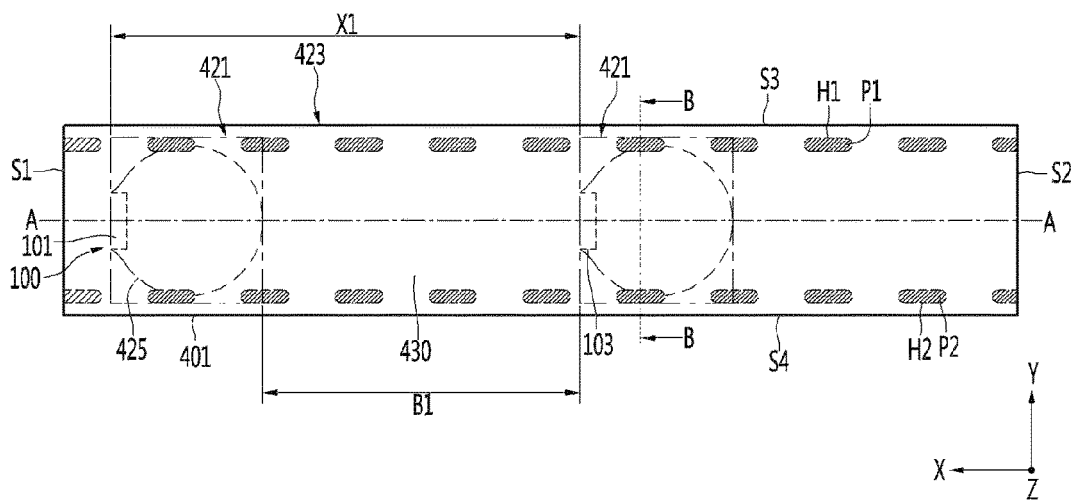
FIG. 3 is an example of a plan view of the lighting device of FIG. 1.
Figure 4:
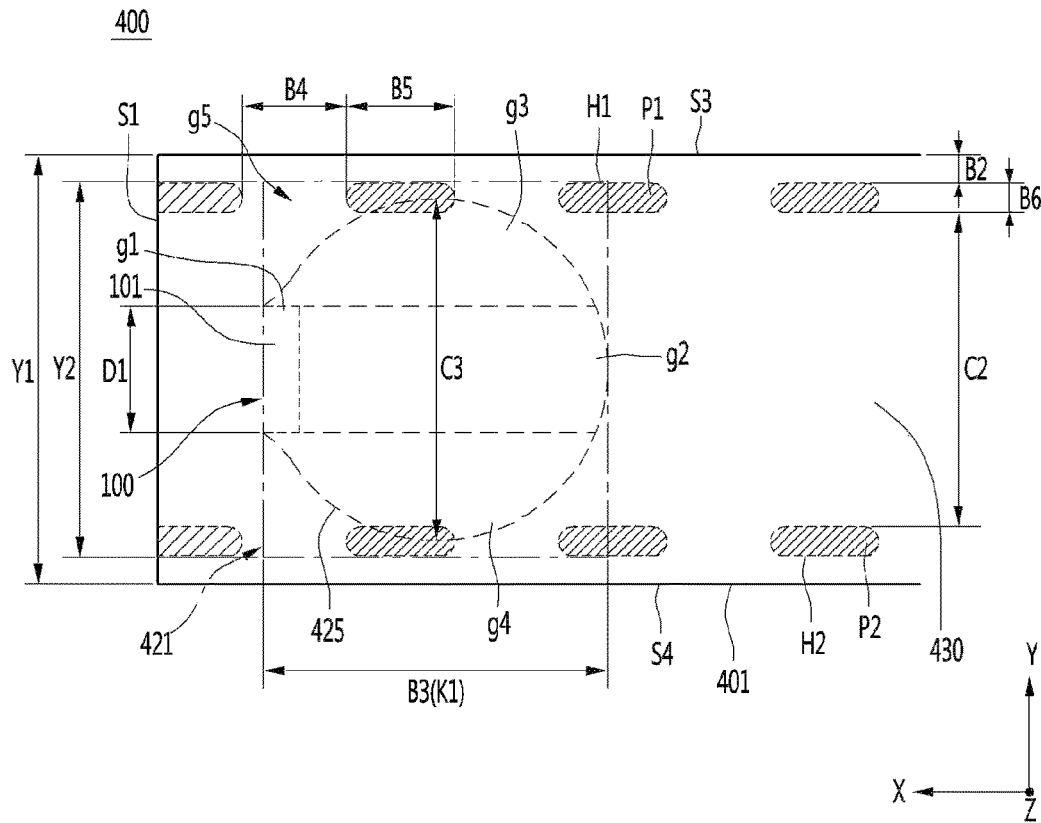
FIG. 4 is a partially enlarged view of the lighting device of FIG. 3.
Figure 7:
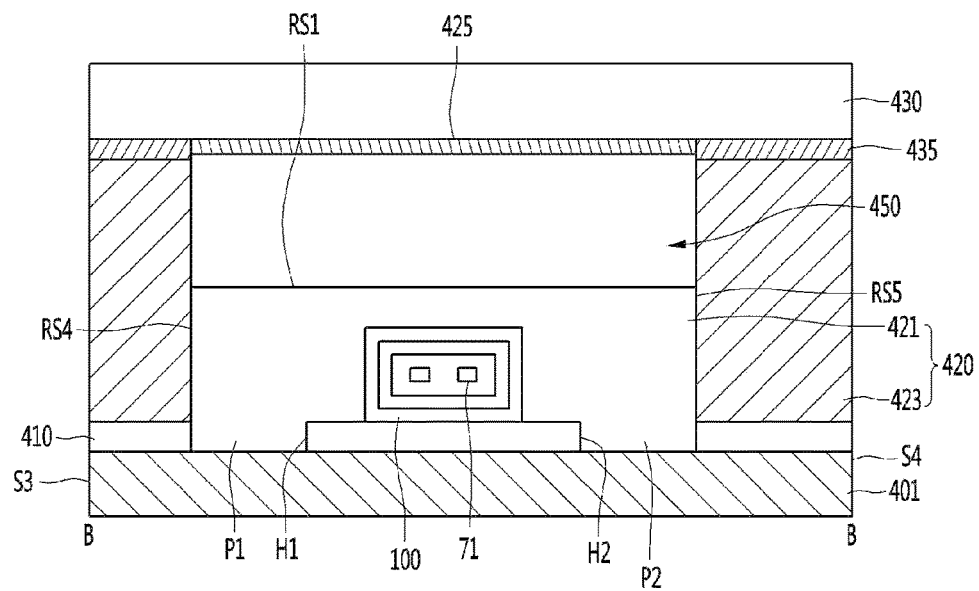
FIG. 7 is a cross-sectional view taken line B-B of the lighting device of FIG. 3.

Referring to FIGS. 2, 3, and 7, the reflective member 410 may include a plurality of open regions H1 and H2. The plurality of open regions H1 and H2 include a plurality of first and second open regions H1 and H2, and the plurality of first open regions H1 may be arranged in a first direction, and the the plurality of second open regions H2 may be arranged in the first direction. The first and second open regions H1 and H2 may be spaced apart in a second direction. The first open regions H1 are adjacent to the third outer surface S3 of the substrate 401, and the second open regions H2 are adjacent to the fourth outer surface S4 of the substrate 401. Each of the first open regions H1 may overlap each of the second open regions H2 in a second direction. The first and second open regions H1 and H2 may not overlap the light emitting devices 101 and 103 in the first direction. The first and second open regions H1 and H2 and the opening 417 may not overlap in the second direction. Each of the first and second open regions H1 and H2 may have an elliptical shape having a long shape in a first direction, a circular shape, or a polygonal shape. Each of the first and second open regions H1 and H2 may have an interval B4 in the first direction less than a length B5 of the first and second open regions H1 and H2 in the first direction. Here, it has a relationship of B5>B4, and a difference between the interval B4 and the length B5 may range from 0.1 mm to 1 mm. Since the lengths B5 of each of the first and second open regions H1 and H2 of the reflective member 410 are long in the first direction, it is possible to prevent deterioration of the adhesive strength of the region adjacent to the long-side edge of the substrate 401. That is, a decrease in adhesive strength of the reflective member 410 disposed between the third outer surface S3 of the substrate 401 and the first open region H1, and between the fourth outer side surface S4 of the substrate 401 and the second open region H2 may be prevented. Referring to FIG. 4, an interval C2 between the first and second open regions H1 and H2 may be greater than the length D1 in the second direction of the light emitting devices 101 and 103, and the length D1 may be 1.5 times or more. A width B6 in the second direction in the first and second open regions H1 and H2 may be less than ⅕ of the length B5, for example, in the range of ⅕ to 1/10. The width B6 may be 1.2 mm or less, for example, in the range of 0.8 mm to 1.2 mm. Each of the first and second open regions H1 and H2 may prevent a decrease of an adhesion in the second direction rather than in the first direction. The first and second open regions H1 and H2 are spaced apart from the third and fourth outer surfaces S3 and S4 of the substrate 401 with a predetermined interval B2, and the interval B2 may be 1.2 mm or less, for example, may be in a range of 0.5 mm to 1.2 mm. When the interval B2 is smaller than the above range, the adhesion of the reflective member 410 disposed outside the first and second open regions H1 and H2 may be reduced, and when it is larger than the above range, the reflective area may be reduced. The reflective member 410 may be disposed outside the first and second open regions H1 and H2 and exposed on the third and fourth outer surfaces S1 and S2 of the substrate 401. The resin layer 420 may be disposed on the first and second open regions H1 and H2 and the reflective member 410. The resin layer 420 may be adhered to the upper surface of the substrate 401 through the first and second open regions H1 and H2 to fix the outer portion of the reflective member 410.

Referring to FIGS. 1 to 4, the resin layer 420 may be disposed on the substrate 401. The lower surface of the resin layer 420 may face the upper surface of the substrate 401. The resin layer 420 may be disposed on the entire upper surface or a partial region of the substrate 401. The resin layer 420 may be disposed on the reflective member 410. The resin layer 420 may be disposed on the entire upper surface or a partial region of the reflective member 410. An area of the lower surface of the resin layer 420 may be equal to or smaller than an area of the upper surface of the substrate 401. The resin layer 420 may be formed of a transparent material. The resin layer 420 may include at least two types of resin materials such as silicone, UV resin, or epoxy. The resin layer 420 may include a thermosetting resin material, and may selectively include, for example, PC, OPS, PMMA, and PVC. The resin layer 420 may be formed of glass. For example, as a main material of the resin layer 420, a resin material containing urethane acrylate oligomer as a main material may be used. For example, the main material may be used a mixture of a synthetic oligomer, urethane acrylate oligomer, and a polyacrylic polymer type. Of course, it may further include a monomer in which a low-boiling-point dilution-type reactive monomer such as IBOA (isobornyl acrylate), HPA (Hydroxylpropyl acrylate, 2-HEA (2-hydroxyethyl acrylate), etc.) may be further included, and as an additive, a photoinitiator (for example, 1-hydroxycyclohexyl phenyl-ketone, Diphenyl) or an antioxidant or the like may be mixed. Since the resin layer 420 is provided as a layer that guides light with a resin, it can be provided with a thinner thickness and a flexible plate compared to the case of glass. The resin layer 420 may emit a point light source emitted from the light emitting devices 101 and 103 in the form of a line light source or a surface light source. A bead diffuses and reflects the incident light, thereby increasing the amount of light, and the bead may be disposed in a range of 0.01% to 0.3% of the weight of the resin layer 420. The beads may be composed of any one selected from silicon, silica, glass bubble, PMMA (Polymethyl methacrylate), urethane, Zn, Zr, $Al_2O_3$, acryl. In addition, a particle diameter of the beads may range from about 1 µm to about 20 µm. The resin layer 420 according to an embodiment of the invention may include resin portions 421 and 423 of different materials. The resin portions 421 and 423 may include at least two types of resin materials, and may be disposed in different regions of the resin layer 420. The resin layer 420 includes first resin portions 421 and a second resin portion 423 which are formed of different resin materials. The first and second resin portions 421 and 423 may be alternately disposed in at least a first direction. The first and second resin portions 421 and 423 may be arranged alternately in the first direction and repeated one or more times in the second direction. The second resin portion 423 may be disposed between the plurality of first resin portions 421. The first resin portion 421 may be disposed between the plurality of second resin portions 423. The second resin portion 423 may be disposed on both sides of the first resin portion 421 or may be disposed around the first resin portion 421. The second resin portion 423 may contact at least two or all of the side surfaces of the first resin portion 421.

The first resin portion 421 may be disposed on the light source 100 and seal the light source 100. The first resin portion 421 is disposed on each of the light emitting devices 101 and 103 and may cover each of the light emitting devices 101 and 103. The first resin portion 421 may include an inclined upper surface RS1 and first and second side surfaces RS2 and RS3 facing each other in a first direction. The second resin portion 423 may be spaced apart from each of the light emitting devices 101 and 103. The second resin portion 423 may be spaced apart from the emission surface 81 of each of the light emitting devices 101 and 103. The first resin portion 421 may be formed of a silicone resin or a thermosetting resin material, and the second resin portion 423 may be made of a UV resin material. The resin layer 420 may include resin materials cured by different curing methods. The resin layer 420 may include a resin material that causes outgassing and a resin material that does not cause outgassing. That is, in the resin layer 420, a problem caused by outgassing may be eliminated by disposing a material that does not cause outgassing between the material causing the outgassing and the light emitting devices 101 and 103. For example, the UV resin material emits or causes outgassing in a process such as reflow or in a high temperature and high humidity environment. Here, when the UV resin material is adjacent to each light emitting devices 101 and 103 or adjacent to each light emitting diode chip 71, gas is released in a high temperature and high humidity environment, and the released gas may cause a phenomenon of discoloring the emission surfaces 81 of the light emitting devices 101 and 103 or carbonizing the surface of the light emitting diode chip 71. Due to the discoloration of the molding member 80 or carbonization of the surface of the LED chip, the luminous flux may decrease or the optical reliability of the light source may decrease. Accordingly, the material of the resin covering the light emitting devices 101 and 103 is formed of a material that does not cause outgassing, so that problems caused by outgassing can be prevented. When the resin layer 420 is formed of a silicone resin material, there is a problem that the silicone resin material does not adhere to some types of adhesives, for example, acrylic adhesives. On the other hand, the UV resin material has no adhesion problem with the above-described adhesive, and is more competitive than silicone resin in terms of cost. Therefore, the invention may solve the problem due to outgassing and to form the resin layer 420 into the first resin portion 421 of the silicone resin and the second resin portion 423 of the UV resin for adhesion with the adhesive layer.

A region of the upper surface RS1 of the first resin portion 421 overlapping the light emitting devices 101 and 103 in a vertical direction may be horizontal or inclined, and a region overlapping a region between the light emitting devices 101 and 103 and the second resin portion 423 in the vertical direction may include an inclined, concave curved surface, or a convex curved surface. When the upper surface RS1 of the first resin portion 421 is an inclined plane, it may have an inclination. The upper surface RS1 of the first resin portion 421 may have an inclination of an imaginary straight line connecting the lowermost end PS1 and the uppermost end PS2. The upper surface RS1 of the first resin portion 421 may be spaced apart from the first diffusion layer 430. When a plurality of the light emitting devices 101 and 103 are arranged in N rows and M columns, a plurality of the first resin portions 421 may be arranged in N rows and M columns. Here, the M and N are integers greater than or equal to 1, and may have a relationship of N≥M. The second resin portions 423 may be disposed between the first resin portions 421, respectively, and may be connected or separated from each other. The second resin portions 423 may be integrally formed outside the plurality of first resin portions 421.

The lowermost end PS1 of the upper surface RS1 of the first resin portion 421 may be disposed lower than an upper end or an upper surface of the second resin portion 423. Among the upper surfaces RS1 of the first resin portion 421, the lowermost end PS1 may be disposed equal to or higher than the upper surfaces of the light emitting devices 101 and 103. Among the upper surfaces RS1 of the first resin portion 421, the lowermost end PS1 may be equal to or higher than the upper end of the front surface of the light emitting devices 101 and 103 and may be the same as or different from the upper end of the rear surface. When the first resin portion 421 covers at least the front surface (i.e., a head surface) of the side surfaces of the light emitting devices 101 and 103, it may be possible to prevent a decrease in light extraction efficiency and protect it from the second resin portion 423.

The uppermost end PS2 of the first resin portion 421 may be the same as or different from the upper end of the second resin portion 423. When the uppermost end PS2 of the first resin portion 421 is the same as the upper end of the second resin portion 423, it may be convenient to form and fix the second resin portion 423 after the first resin portion 421 is formed. When the uppermost end PS2 of the first resin portion 421 is higher than the upper end of the second resin portion 423, the inclination angle of the inclined upper surface may be increased and a problem overflowing the first adhesive layer through the upper surface of the first resin portion 421 may suppress. When the uppermost end PS2 of the first resin portion 421 is lower than the upper end of the second resin portion 423, a gap between the light emitting devices 101 and 103 and the second resin portion 423 may be reduced, and a height of an air region 450 may be provided higher.

As shown in FIG. 1, a length K1 of the first resin portion 421 and a length K2 of the second resin portion 423 in a first direction or a row direction may be the same or different from each other. The ratio K1:K2 of the length K1 of the first resin portion 421 to the length K2 of the second resin portion 423 in the horizontal direction or the first direction may include in a range of 6:4 to 4:6. Since the length K1 of the first resin portion 421 in the first direction is arranged in a range of 40% to 60% of the length K2 of the second resin portion 423, the emission surface 81 may be spaced apart from the second resin portion 423 by a stable distance. The minimum distance E1 between the emission surfaces 81 of the light emitting devices 101 and 103 and the second resin portion 423 may be 3 mm or more, for example, 5 mm or more. The upper surface area of the first resin portion 421 may be equal to or smaller than the upper surface area of the second resin portion 423.

Referring to FIG. 2, a first resin portion 421 includes an upper surface RS1 disposed on the light emitting devices 101 and 103, a first side surface RS2 disposed in front surface of the emission surface 81 of the light emitting devices 101 and 103, and a second side surface RS3 disposed on the rear surfaces (i.e., a side opposite to the emission surface) of the light emitting devices 101 and 103. As shown in FIG. 7, the third and fourth side surfaces RS4 and RS5 disposed in the second direction of the first resin portion 421 may be spaced apart from the third and fourth outer surfaces S3 and S4. The second resin portion 423 may be disposed to surround both side surfaces RS2, RS3, RS4, and RS5 of the first resin portion 421, so that an area of the first resin portion 421 may be reduced. It is possible to prevent a problem in which the outer portion of the first resin portion 421 is lifted. In addition, since the first and second resin portions 421 and 423 are disposed outside the light emitting devices 101 and 103, moisture penetration through the third and fourth side surfaces RS4 and RS5 may be suppressed. A top view shape of the first resin portion 421 may be a polygonal shape, a circular shape, or an amorphous shape.

Figure 5:
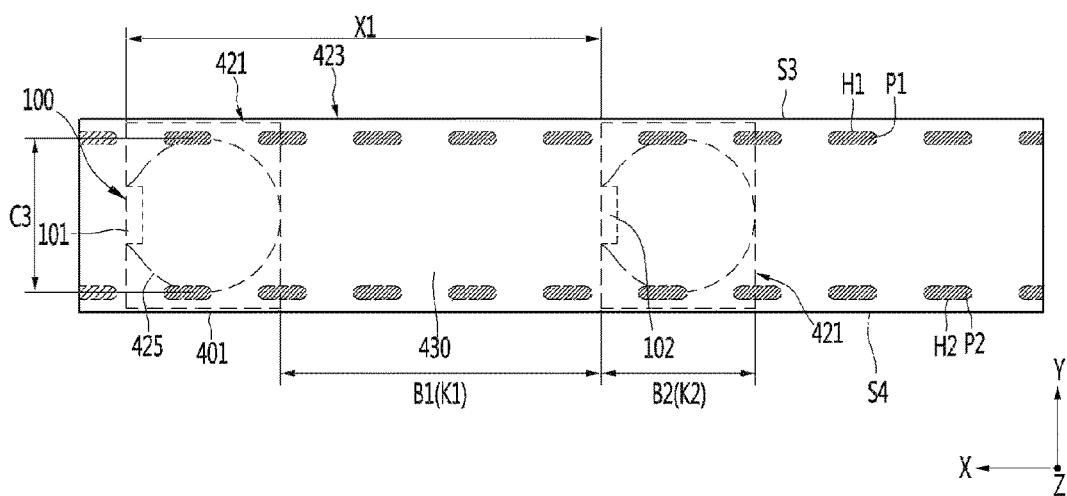
FIGS. 5 and 6 are other examples of the lighting device of FIG. 3.

As shown in FIG. 5, the resin layer 420 has a first resin portion 421 and a second resin portion 423 alternately disposed in a first direction, and the second resin portions 423 may be separated from each other by the first resin portion 421. The first and second resin portions 421 and 423 may be exposed on the third outer side S3 and the fourth outer side S4, respectively. That is, the lengths of the first and second resin portions 421 and 423 in the second direction may be the same. The sum of the upper surface areas of the second resin portions 423 may be greater than the sum of the upper surface areas of the first resin portions 421.

Figure 6:
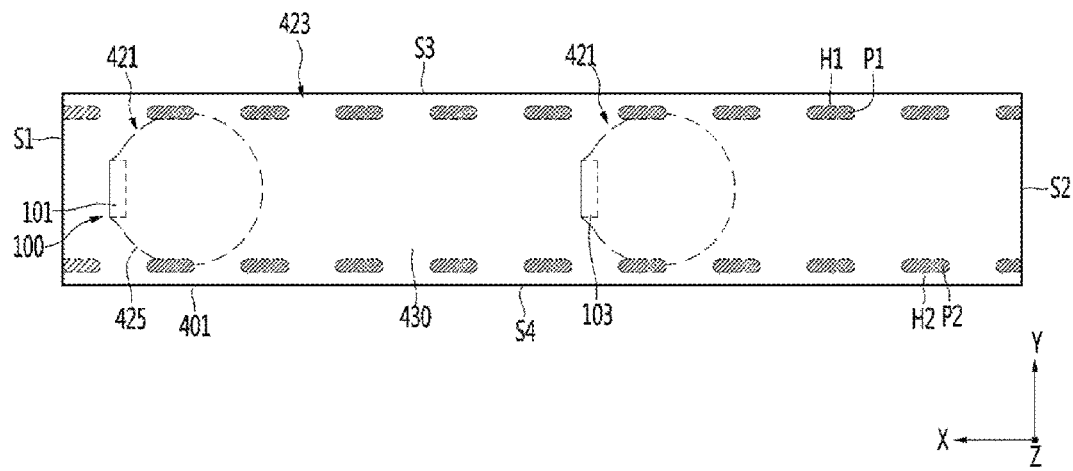

As shown in FIG. 6, the first resin portion 421 of the resin layer 420 may be the same as the region of the light shielding portion 425. Accordingly, the second resin portion 423 may be disposed along the periphery of the first resin portion 421 and may be exposed through the first to fourth outer surfaces S1, S2, S3, and S4.

As shown in FIGS. 1 to 3, since the first resin portion 421 of the resin layer 420 is disposed on the light emitting devices 101 and 103, it is possible to protect the light emitting devices 101 and 103, and may reduce a loss of light emitted from the light emitting device 101 and 103. The upper surfaces of the light emitting devices 101 and 103 may be embedded in a lower portion of the first resin portion 421. As shown in FIG. 2, the first resin portion 421 may contact the surfaces of the light emitting devices 101 and 103 and may contact the emission surfaces 81 of the light emitting devices 101 and 103. A part of the first resin portion 421 may be disposed in the opening 417 of the reflective member 410. A part of the first resin portion 421 may contact the upper surface of the substrate 401 through the opening 417 of the reflective member 410. Accordingly, a part of the first resin portion 421 is in contact with the substrate 401, so that the reflective member 410 may be fixed between the first resin portion 421 and the substrate 401.

The upper surface RS1 of the first resin portion 421 includes a lowermost end PS1 and an uppermost end PS2, a position of the lowermost end PS1 may be adjacent to the upper surface and/or the rear surface of the first and second light emitting devices 101 and 103, and a position of the uppermost end PS2 may be disposed at a position farthest from the first and second light emitting devices 101 and 103 or the lowermost end PS1 in a direction of the second outer surface S2. The height Z0 of the lowermost end PS1 may be equal to or higher than the height of the upper surfaces of the light emitting devices 101 and 103 with respect to the upper surface of the substrate 401 or the upper surface of the reflective member 410. The height Z0 of the lowermost end PS1 may be 1 mm or more, for example, in the range of 1.4 mm to 1.6 mm. The height Z1 of the uppermost end PS2 may be disposed equal to or higher than the upper surface of the second resin portion 423. The lowermost end PS1 may be an upper end of the second side surface RS3, and the uppermost end PS2 may be an upper end of the first side surface RS2. The upper surface RS1 of the first resin portion 421 may have a height gradually higher from the lowermost end PS1 to the uppermost end PS2. The upper surface RS1 of the first resin portion 421 may be disposed at a height gradually higher as it moves away from each of the light emitting devices 101 and 103 in the first direction. Here, the air region 450 may be provided as a region having a gradually smaller gap as the distance from each of the light emitting devices 101 and 103 in the first direction increases. The upper surface RS1 of the region A2 vertically overlapping the light emitting devices 101 and 103 in the first resin portion 421 may be inclined or disposed horizontally. The air region 450 may be a region without a resin material. The second side surface RS3 of the first resin portion 421 may be in contact with or spaced apart from the rear surfaces of the light emitting devices 101 and 103. In this case, when the second side surface RS3 of the first resin portion 421 is disposed outside the rear surfaces of the light emitting devices 101 and 103, the manufacturing process of the second resin portion 423 may be convenient. A part of the first resin portion 421 may be disposed in the opening 417 of the reflective member 410. The first side surface RS2 and the second side surface RS3 of the first resin portion 421 may contact the second resin portion 423. In the first resin portion 421, an interval between the second side surface RS3 in contact with the second resin portion 423 and the light emitting devices 101 and 103 may be smaller than an interval between the first side surface RS2 in contact with the second resin portion 423 and the light emitting devices 101 and 103. As shown in FIG. 7, the first resin portion 421 may include a third side surface RS4 adjacent to the third outer surface S3 and a fourth side surface RS5 adjacent to the fourth outer surface S4. A second resin portion 423 may be disposed between the third side surface RS4 of the first resin portion 421 and the third outer side surface S3. A second resin portion 423 may be disposed between the fourth side surface RS4 and the fourth outer side surface S4 of the first resin portion 421. The second resin portion 423 disposed outside the third and fourth side surfaces RS4 and RS5 of the first resin portion 421 protects the first resin portion 421, and may suppress moisture penetration toward the light emitting devices 101 and 103. A boundary portion between the third and fourth side surfaces RS4 and RS5 and the first and second side surfaces RS2 and RS3 may be an angled surface or a convex curved surface. The plurality of light emitting devices 101 and 103 and a plurality of first resin portions 421 may be disposed between the outer side surfaces S1 and S2 of the second resin portion 423. At least one of the second resin portions 423 may be disposed between the plurality of first resin portions 421. As shown in FIGS. 3 and 7, the resin layer 420 may include a first protrusion P1 disposed in the first open region H1 and a second protrusion P2 disposed in the second open region H2. The first protrusion P1 may be attached to the upper surface of the substrate 401 along the first open region H1. The first protrusion P1 may be disposed in the first open region H1 to prevent a decrease in adhesion in the outer region of the reflective member 410 adjacent to the first outer surface S1 of the substrate 401. The second protrusion P2 may be attached to the upper surface of the substrate 401 along the second open region H2. The second protrusion P2 may be disposed in the second open region H2 of the reflective member 410 and may prevent a decrease in adhesion in the outer region of the reflective member 410 adjacent to the second outer surface S2 of the substrate 401.

The first protrusions P1 are arranged in a first direction, the second protrusions P2 are arranged in a first direction, and the first and second protrusions P1 and P2 may be spaced apart from each other in the second direction. The first protrusion P1 and the second protrusion P2 may protrude lower than the upper surface of the reflective member 410. The first protrusion P1 and the second protrusion P2 may protrude toward a lower surface of the substrate 401. The first protrusion P1 and the second protrusion P2 may prevent a problem that the edge region of the reflective member 410 is lifted, and may be disposed in a bezel region of a housing to which the lighting device is coupled.

As shown in FIGS. 3 and 7, the first and second protrusions P1 and P2 disposed in the first and second open regions H1 and H2 at a region of the first resin portion 421 may be formed of a material of the resin portion 421. The first and second protrusions P1 and P2 disposed in the first and second open regions H1 and H2 at a region of the second resin portion 423 may be formed of a material of the second resin portion 423. At least one of the first and second protrusions P1 and P2 may overlap with the first and second resin portions 421 and 423 in a vertical direction, and may be formed of a material of the first and second resin portions 421 and 423. As shown in FIG. 6, a region overlapping the first and second resin portions 421 and 423 in a vertical direction among the first and second protrusions P1 and P2 may be formed of a material of the first and second resin portions 421 and 423.

As shown in FIGS. 1 and 2, a thickness Z1 of the resin layer 420 may be 1.5 mm or more, for example, in the range of 1.5 to 2.5 mm. When the thickness Z1 of the resin layer 420 is thicker than the above range, luminous intensity may be lowered, and it may be difficult to provide a soft device due to an increase in device thickness. When the thickness Z1 of the resin layer 420 is smaller than the above range, it is difficult to provide a surface light source having a uniform light intensity.

The length of the resin layer 420 in the first direction may be the same as the length of the substrate 401 in the first direction, and the width of the resin layer 420 in the second direction may be the same as the width (Y1, see FIG. 4) of the second direction of the substrate 401. Accordingly, each side surface of the resin layer 420 may be disposed on the same plane as each side surface of the substrate 401. For example, the third and fourth outer surfaces S3 and S4 of the substrate 401 may be disposed on a vertical surface such as both sides of the resin layer 420. The first resin portions 421 are provided in a size covering each of the plurality of light emitting devices 101 and 103 and may be separated from each other or connected to each other.

As shown in FIG. 2, the maximum thickness Z4 of the first resin portion 421 may be equal to, greater than or less than the thickness of the second resin portion 423. In this case, the first and second resin portions 421 and 423 are formed by different processes, and the second resin portion 423 is formed after the first resin portion 421 is formed, or, conversely, the second resin portion 423 may be formed and then the first resin portion 421 may be formed. Accordingly, when the maximum thickness Z4 of the first resin portion 421 is the same as the thickness of the second resin portion 423, the process of the first and second resin portions 421 and 423 may be convenient. The minimum thickness Z0 of the first resin portion 421 may be greater than the thickness of the light emitting devices 101 and 103, and may be smaller than the thickness of the second resin portion 423. The adhesion of the upper surface of the second resin portion 423 may be higher than that of the upper surface of the first resin portion 421. The upper surface RS1 of the first resin portion 421 may include a light shielding structure. The light shielding structure may include at least one of an inclined surface, a concave curved surface, and a convex curved surface. The light shielding structure may include one or a plurality of concave portions and one or a plurality of convex portions, and may be disposed adjacent to each other. The light shielding structure may be disposed on a region between the light emitting devices 101 and 103 and the second resin portion 423 to reflect or refract light emitted from the light emitting devices 101 and 103. This light shielding structure may suppress hot spots caused by light emitted from the light emitting devices 101 and 103. In the light shielding structure, since the light emitting devices 101 and 103 emit light in a side direction, that is, in the first direction, a region capable of increasing light shielding efficiency by the distribution of the light directivity distribution of the light emitting devices 101 and 103 and the light reflection characteristics may cover.

As shown in FIGS. 1 to 4, the light shielding portion 425 may face an upper surface of the substrate 401. The light shielding portion 425 may overlap the light emitting devices 101 and 103 in a vertical direction. Each of the plurality of light shielding portions 425 may overlap each of the plurality of light emitting devices 101 and 103 in a vertical direction. As shown in FIGS. 1 and 3, an interval B1 between the light shielding portions 425 may be smaller than the interval X1 between the light emitting devices 101 and 103. The light shielding portion 425 may be spaced apart from the first and third outer surfaces S3 and S4 of the resin layer 420. A plurality of the light shielding portions 425 may be arranged in the first direction. The plurality of light shielding portions 425 may have the same shape. The light shielding portion 425 may be divided into a first light shielding portion on the first light emitting device 101 and a second light shielding portion on the second light emitting device 103. The first and second light shielding portions may be disposed above an emission direction of each of the first and second light emitting devices 101 and 103. As shown in FIGS. 2 to 4, the light shielding portion 425 may be disposed higher than the upper surface of the resin layer 420 or the upper surface of the second resin portion 423. The light shielding portion 425 may be at least 50% of the upper surface area of the light emitting devices 101 and 103 on the light emitting devices 101 and 103, or may range from 50% to 200%. The light shielding portion 425 may be a region printed with a white material. The light shielding portion 425 may be printed using reflective ink containing any one of $TiO_2$, $Al_2O_3$, $CaCO_3$, $BaSO_4$, and Silicon. The light shielding portion 425 reflects light emitted through the emission surfaces of the light emitting devices 101 and 103 to reduce the occurrence of hot spots on the light emitting devices 101 and 103. The light shielding portion 425 may print a shading pattern using shading ink. The light shielding portion 425 may be formed in a manner that is printed on a lower surface of the first diffusion layer 430. The light shielding portion 425 does not block 100% of incident light and may have a transmittance lower than a reflectance, so that the light may be blocked and diffused. The light shielding portion 425 may be formed in a single layer or in multiple layers, and may have the same pattern shape or different pattern shapes. The light shielding portion 425 may have the same thickness. The thickness of the light shielding portion 425 may be gradually thinner toward the emission direction based on the light emitting devices 101 and 103. The thickness of the light shielding portion 425 may be reduced in proportion to the incident light intensity. The size of the light shielding portion 425 may be disposed in a range of 50% or more, for example, 50% to 200% of the upper surface area of the light emitting devices 101 and 103, and may block incident light. Accordingly, it is possible to reduce the visible problem of the light emitting devices 101 and 103 from the outside, and reduce hot spots on the areas of the light emitting devices 101 and 103, thereby providing a uniform light distribution over the entire region. As another example, the light shielding portion 425 may be an air region of a recess etched by an etching process of the lower surface of the first diffusion layer 430 or may include a light shielding film in which the light shielding material is disposed in the recess region. The etching region may cover the emission surfaces of the light emitting devices 101 and 103 and is disposed in a range of 50% to 200% of the upper surface area of of the light emitting devices 101 and 103, like a region of the light shielding portion. The light shielding portion 425 may be arranged in a hemispherical shape, an oval shape, or a circular shape with respect to the light emitting devices 101 and 103.

As shown in FIGS. 2 and 4, a width in the second direction of the region adjacent to the light emitting devices 101 and 103 in the light shielding portion 425 is small and gradually increases toward the center of the light shielding portion 425, and a width (e.g., C3) in the second direction from the center may be maximized. The width of the second direction may gradually decrease from the central portion of the light shielding portion 425 in a direction away from the light emitting devices 101 and 103. The maximum width C3 in the second direction from the central portion of the light shielding portion 425 may be the largest, and the width in the second direction gradually decreases from the central portion of the light shielding portion 425 to the first direction. A region of the light shielding portion 425 overlapping the light emitting devices 101 and 103 in a vertical direction has a flat inner surface, and a width in the second direction may be greater than the length D1 in the second direction of the light emitting devices 101 and 103. The minimum width of the light shielding portion 425 in the second direction is equal to the length D1 of the light emitting devices 101 and 103, or more than 0.8 mm larger than the length D1 of the light emitting devices 101 and 103, the light shielding portion 425 may be covered both sides of the light emitting devices 101 and 103 and and may be prevented hot spots caused by light emitted from the light emitting devices 101 and 103.

As shown in FIG. 4, the light shielding portion 425 includes a first region g1 vertically overlapping the light emitting devices 101 and 103, and a second region g2 extending in a first direction from the first region g1, a third region g3 extending from the first and second regions g1 and g2 in a direction of the third outer surface S3 of the substrate 401, and a fourth region g4 extending from the first and second regions g1 and g2 in a direction the fourth outer surface S4 of the substrate 401. The third and fourth regions g3 and g4 may extend from the first and second regions g1 and g2 in the direction of the third outer side surface S3 and in a direction of the fourth outer side surface S4 of the substrate 401. The second to fourth regions g2 to g4 are disposed in upper peripheral regions of the light emitting devices 101 and 103 and may not overlap the light emitting devices 101 and 103 in a vertical direction. An area of the first region g1 may be 50% or more of the upper surface area of the light emitting devices 101 and 103. A light shielding area in the second region g2 may be the largest and may be larger than the light shielding area in the third and fourth areas g3 and g4. The first to fourth regions g1, g2, g3, and g4 block light through upper portions of the light emitting devices 101 and 103 and upper portions of the emission regions, thereby suppressing the occurrence of hot spots. The outer portion of the region g2 may include a convex curved surface. The outer periphery of the second region g2 may have a convex curved surface from the center of the first light shielding portion toward the second light shielding portion. A distance between the outer portion of the second region g2 and the first region g1 may be the farthest from the center side and gradually narrowed toward the side. Outer portions of the third and fourth regions g3 and g4 may include the convex curved surface. The outer portions of the third and fourth regions g3 and g4 may include curved surfaces that are convex toward the third and fourth outer surfaces S3 and S4 of the substrate 401 from the center of the light shielding portion 425. The outer periphery of the third region g3 may be the most convex at a center side, and may be connected to the outer periphery of the first region g1 by a convex curved surface, and may be connected to the outer periphery of the second region g2 by a convex curved surface. The outer periphery of the fourth region g4 may be the most convex at a center side, and may be connected to the outer periphery of the first region g1 by a convex curved surface, and may be connected to the outer periphery of the second region g2 by a convex curved surface. The distance between the outer portion of the third region g3 and the outer portion of the fourth region g4 may be the largest, and the distance gradually may decrease toward the side thereof.

The third region g3 of the light shielding portion 425 may overlap any one of the first open regions H1 in a vertical direction. The fourth region g4 of the light shielding portion 425 may overlap any one of the second open regions H2 in a vertical direction. The third region g3 of the light shielding portion 425 may overlap with any one of the first protrusions P1 in a vertical direction. The fourth region g4 of the light shielding portion 425 may overlap with any one of the second protrusions P2 in a vertical direction. Among the first and second protrusions P1 and P2, protrusions overlapping the light shielding portion 425 in a vertical direction may be adjacent to both sides of the emission surface 81 of the light emitting devices 101 and 103. The maximum length B3 in the first direction of the light shielding portion 425 may be equal to or smaller than the maximum width C3 in the second direction. The maximum width C3 may be 13 mm or more, for example, in the range of 13 mm to 17 mm. The maximum width C3 of the light shielding portion 425 in the second direction may vary according to the length of the light emitting devices 101 and 103 in the second direction. The maximum width C3 of the light shielding portion 425 in the second direction may be disposed in a range of 50% or more, for example, 50% to 90% of the length Y1 of the substrate 401 in the second direction. The maximum length B3 in the first direction of the light shielding portion 425 may be in a range of 0.3 times or more, for example, 0.3 times to 0.52 times an interval between the light emitting devices 101 and 103 (X1 in FIG. 2). The maximum length B3 in the first direction of the light shielding portion 425 may be disposed in a range of 6 times or more, for example, 6 to 10 times the width of the light emitting devices 101 and 103 in the first direction. Here, the interval X1 between the light emitting devices 101 and 103 may be 25 mm or more, for example, in the range of 25 mm to 30 mm, and may vary depending on the characteristics of the light emitting devices 101 and 103. The light shielding portion 425 provides the maximum length B3 in the first direction passing through the center of the light shielding portion 425 and the maximum width C3 in the second direction in the above ranges, so that the hot spot on the light emitting devices 101 and 103 may reduce and the light uniformity may improve. The central portion of the light shielding portion 425 may be disposed in a range of 4.5 mm or more, for example, 4.5 mm to 6.5 mm on the first region g1 overlapping the light emitting devices 101 and 103. The thickness of the light shielding portion 425 may be 0.1 times or less, for example, 0.05 times to 0.1 times the thickness Z1 of the resin layer 420. The thickness of the light shielding portion 425 may be 100 μm or more, for example, in a range of 100 to 200 μm. When the thickness of the light shielding portion 425 is smaller than the above range, there is a limit to reducing the hot spot, and when it is larger than the above range, the light uniformity may decrease. A distance between the upper surfaces of the light emitting devices 101 and 103 and the lower surface of the light shielding portion 425 may be 0.4 mm or more, for example, in the range of 0.4 mm to 0.6 mm. The distance Z0 between the upper surfaces of the light emitting devices 101 and 103 and the upper surface of the reflective member 410 may be 0.8 mm or more, for example, in a range of 0.8 mm to 1.4 mm. The region of the light shielding portion 425 may not overlap a region of the first adhesive layer 435 in a vertical direction.

Meanwhile, the air region 450 may be disposed between the resin layer 420 and the first diffusion layer 430. The air region 450 may be disposed between the first resin portion 421 and the first diffusion layer 430. The air region 450 may be disposed between the first resin portion 421 and the light shielding portion 425. The air region 450 and the light shielding portion 425 may be disposed between the resin layer 420 and the first diffusion layer 430. The air region 450 and the light shielding portion 425 may overlap the first resin portion 421 in a vertical direction. The air region 450 may be disposed between the second resin portions 423 in a horizontal direction. The lower surface of the air region 450 may be provided in the same area as the upper surface of the first resin portion 421. The upper surface of the air region 450 may be equal to or larger than the lower surface area of the light shielding portion 425, and may be equal to or smaller than the upper surface area of the first resin portion 421. The upper surface area of the air region 450 may be greater than or equal to the lower surface area of the light shielding portion 425 and less than or equal to the upper surface area of the first resin portion 421. The depth of the air region 450 may be a maximum in a region perpendicular to the light emitting devices 101 and 103 with respect to the lower surface of the first diffusion layer 430 and may have a minimum depth at the uppermost end PS2 of the first resin portion 421. The depth of the air region 450 may be the smallest at the uppermost end PS2 of the first resin portion 421 with respect to the lower surface of the light shielding portion 425 and may be largest at the rear upper end of the light emitting devices 101 and 103. The depth of the air region 450 may gradually increase as the air region 450 is adjacent to the light emitting devices 101 and 103, and may gradually increase as the air region 450 is further away from the emission surfaces of the light emitting devices 101 and 103.

Here, in the structure of the first resin portion 421 as shown in FIG. 5, the air region 450 may be disposed in the same region as the light shielding portion 425, the first and second resin portions 421 and 423 may be filled outside the air region 450. The upper surface of the resin layer 420 may include an adhesive region in which the first adhesive layer 435 is disposed and a non-adhesive region without the first adhesive layer 435. The non-adhesive region may be a region of the light shielding portion 425. The adhesive region and the non-adhesive region may be alternately disposed.

As shown in FIGS. 1 to 4, the first diffusion layer 430 may be disposed on the resin layer 420. The first diffusion layer 430 may include an adhesive region adhered to an upper surface of the resin layer 420 and a non-adhesive region over the light shielding portion 425. The first diffusion layer 430 may be adhered to the resin layer 420 and the first adhesive layer 435. The first adhesive layer 435 may be disposed between and adhered between the first diffusion layer 430 and the second resin portion 423. The first adhesive layer 435 may overlap the second resin portion 423 in a vertical direction. The first adhesive layer 435 may not overlap the first resin portion 421 in a vertical direction. The first adhesive layer 435 may include at least one of a UV adhesive, an acrylic adhesive, and a transparent adhesive. The upper surface of the first resin portion 421 may be spaced apart or lower than the upper surface of the second resin portion 423 with respect to the first diffusion layer 430. Accordingly, at least one or both of the air region 450 and the light shielding portion 425 may be disposed in a region between the first resin portion 421 and the first diffusion layer 430. Accordingly, shading efficiency may be improved. As another example, the first diffusion layer 430 may be attached on the second resin portion 423 by applying a predetermined pressure or pressure/heat. That is, the first diffusion layer 430 may be adhered to the second resin portion 423 by self-adhesive force without a separate adhesive. Accordingly, the process of separately attaching the adhesive may be reduced, and since the adhesive harmful to the human body may not be used, the process or material waste may be reduced. The first diffusion layer 430 may be adhered to the entire upper surface of the second resin portion 423, and the light shielding portion 425 may be disposed or the light shielding portion 425 may be formed in the non-adhesive region. The first diffusion layer 430 diffuses the light emitted through the resin layer 420. In addition, since the first diffusion layer 430 may not be mixed with specific colors when the luminous intensity of light is high, the first diffusion layer 430 may diffuse and mix the lights. The material of the first diffusion layer 430 may be a light-transmitting material. The first diffusion layer 430 may include at least one of a polyester (PET) film, a polymethyl methacrylate (PMMA) material, or a polycarbonate (PC). The first diffusion layer 430 may be provided as a film made of a resin material such as silicone or epoxy. The first diffusion layer 430 may include a single layer or multiple layers. The thickness of the first diffusion layer 430 is 25 µm or more, and may be, for example, in the range of 25 to 250 µm or in the range of 100 to 250 µm. The first diffusion layer 430 may have the above thickness range and provide incident light as a uniform surface light source. The first diffusion layer 430 may include at least one or two or more of a diffusion agent such as beads, a phosphor, and ink particles. The phosphor may include, for example, at least one of a red phosphor, an amber phosphor, a yellow phosphor, a green phosphor, or a white phosphor. The ink particles may include at least one of metal ink, UV ink, or curing ink. The size of the ink particles may be smaller than the size of the phosphor. The surface color of the ink particles may be any one of green, red, yellow, and blue. The ink types may be selectively applied among PVC (polyvinyl chloride) ink, PC (polycarbonate) ink, ABS (acrylonitrile butadiene styrene copolymer) ink, UV resin ink, epoxy ink, silicone ink, PP (polypropylene) ink, water-based ink, plastic ink, PMMA (poly methyl methacrylate) ink and PS (polystyrene) ink. The ink particles may include at least one of metal ink, UV ink, or curing ink.

Figure 9:
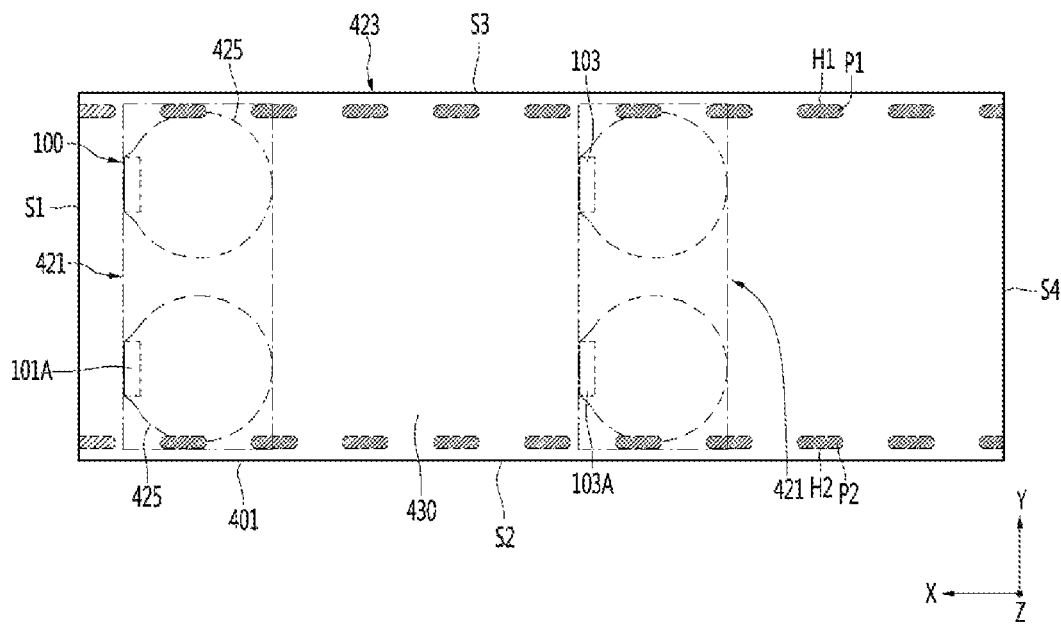
FIG. 9 is a diagram illustrating another example of an arrangement of the lighting device of FIG. 3.

As shown in FIGS. 3, 5, and 6, the light shielding portion 425 may overlap a region of the first resin portion 421 in a vertical direction. As shown in FIGS. 3 and 5, an upper surface area of the first resin portion 421 may be larger than an upper surface area of the light shielding portion 425. As shown in FIG. 6, an area of an upper surface of the first resin portion 421 may be the same as an area of an upper surface of the light shielding portion 425. As shown in FIG. 9, the light shielding portion 425 may be provided a size covering which a plurality of light emitting devices 101, 101A, 103, 103A are arranged in the first and second directions or in the row and column directions, or may be provided a size covering each of the light emitting devices 101, 101A, 103, and 103A. Here, the first resin portion 421 extending in the second direction may be disposed one or more, and one of the first resin portions 421 is a plurality of first light emitting devices 101, 101A, 103 and 103A spaced apart in the second direction, respectively. The plurality of first resin portions 421 disposed in the first direction may be spaced apart from each other. The plurality of first resin portions 421 disposed in the first direction may be disposed between the second resin portions 423, respectively. The second resin portion 423 may be disposed around the plurality of first resin portions 421. The first and second open regions H1 and H2 of the reflective member 410 may be disposed along the third and fourth outer surfaces S3 and S4. Protrusions P1 and P2 of the resin layer 420 may be coupled to the first and second open regions H1 and H2.

FIGS. 10 to 16 are modified examples of the lighting device according to the first embodiment of the invention.

Figure 10:
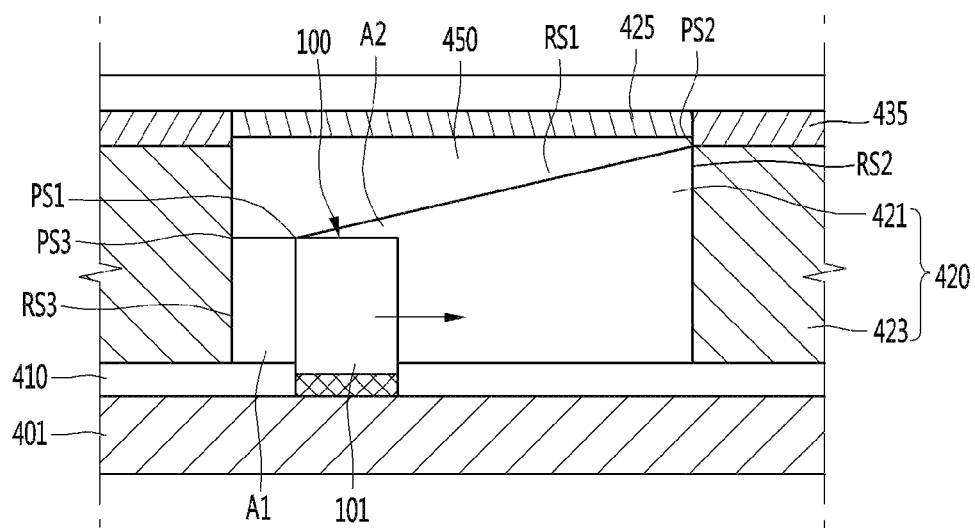
FIGS. 10 to 16 are views showing first to seventh modified examples of the lighting device according to the first embodiment.

Referring to FIG. 10, a first resin portion 421 of the resin layer 420 may include a first sub-region A1 extending in the rear direction of the light emitting devices 101 and 103. The first sub-region A1 of the first resin portion 421 is disposed to be spaced apart from the rear surfaces of the light emitting devices 101 and 103, and the second side surface RS3 may be spaced apart from the light emitting devices 101 and 103 and may be protected the light emitting devices 101 and 103. The upper surface of the first sub-region A1 may be disposed to be flat or inclined. The upper end PS3 of the first sub-region A1 may be disposed at the same height as the lower end PS1. The first sub-region A1 may overlap the reflective member 410 in a vertical direction. Since the air region 450 and the light shielding portion 425 are disposed on the first resin portion 421 having the first sub-region A1, the light shielding efficiency on the light emitting devices 101 and 103 may be improved.

Figure 11:
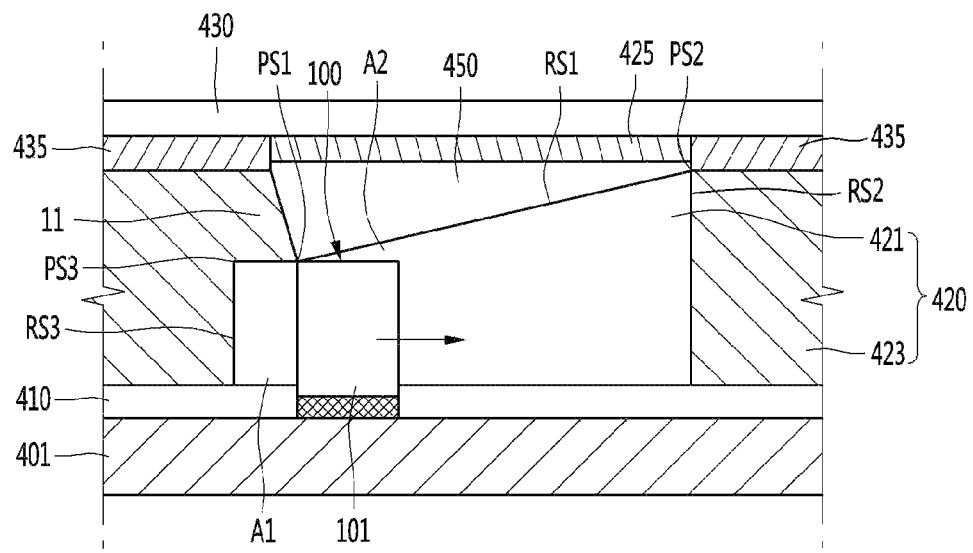

Referring to FIG. 11, the first extension region 11 may extend onto the first sub-region A1. The first extension region 11 extends from the second resin portion 423 to the upper surface of the first resin portion 421, and may contact the upper surface of the first sub-region A1. The inner side of the first extension region 11 may be an inclined side or a vertical side. The first extension region 11 may reduce a decrease in an adhesive area of the first adhesive layer 435 disposed on the second resin portion 423. That is, the first extension region 11 and the first adhesive layer 435 may vertically overlap the first sub-region A1 that is a partial region of the first resin portion 421. Accordingly, it is possible to minimize a decrease in the adhesive area of the first adhesive layer 435 compared to the first embodiment.

Figure 12:
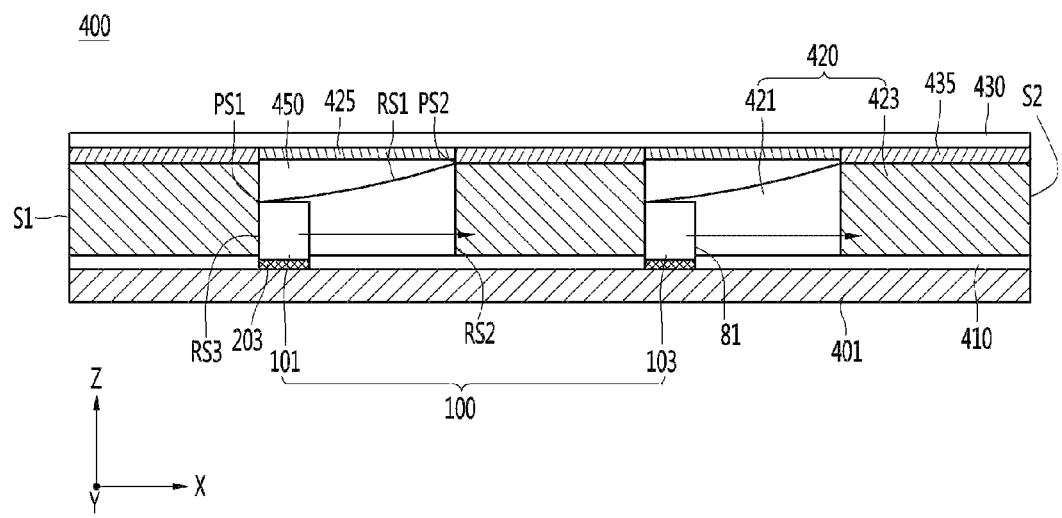

As shown in FIG. 12, in the resin layer 420, the upper surface RS1 of the first resin portion 421 may include a concave curved surface. The concave upper surface RS1 may be concave in the direction of the upper surface of the substrate 401 in the air region 450. The concave upper surface may be provided as a continuous curved surface from the lowermost end PS1 to the uppermost end PS2, or may be provided as a discontinuous curved surface. The uppermost end PS2 of the concave curved surface may be disposed equal to or higher than the upper surface of the second resin portion 423. The upper surface RS1 of the first resin portion 421 may reflect light incident by the concave curved surface toward the second outer surface S2. In this case, the concave curved surface may be a total reflective surface.

Figure 13:
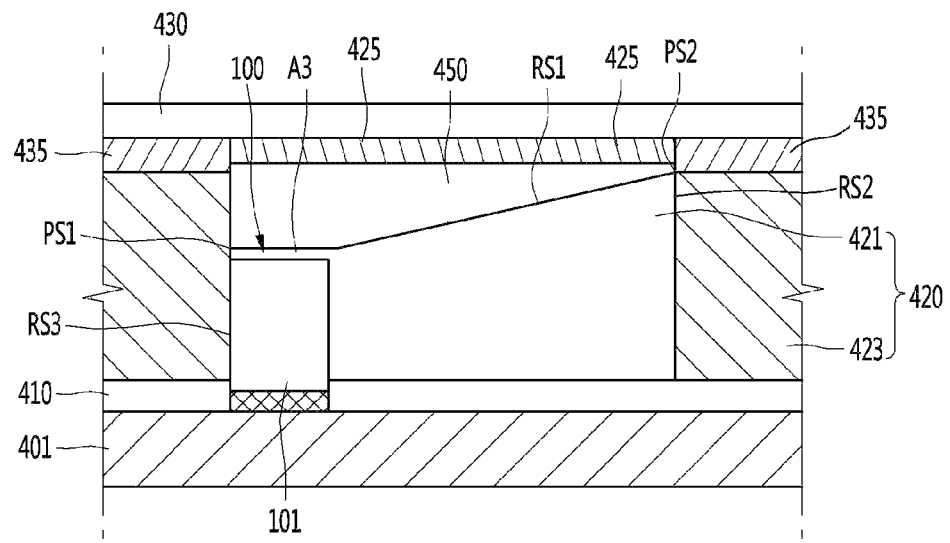

As shown in FIG. 13, in the resin layer 420, the upper surface RS1 of the first resin portion 421 includes a flat region A3, and the flat region A3 may be overlapped with the light emitting devices 101 and 103 in a vertical direction. The flat region A3 may have a predetermined thickness from the upper surfaces of the light emitting devices 101 and 103 and may protect the surfaces of the light emitting devices 101 and 103. The upper surface RS1 of the first resin portion 421 may locate at the lowermost end PS1 in the flat region A3, has an inclined surface from the flat region A3, and may be extended to the uppermost end PS2. The structure of the flat region A3 may protect the upper surfaces of the light emitting devices 101 and 103 and reflect light passing through the emission surfaces of the light emitting devices 101 and 103. The inclined upper surface of the first resin portion 421 may have a concave, convex, or uneven structure.

Figure 14:
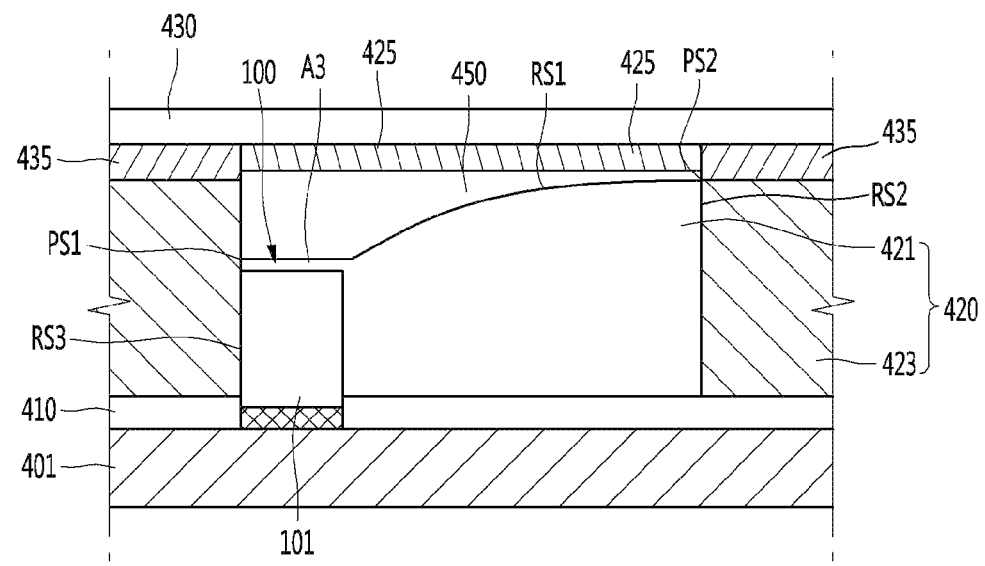

Referring to FIG. 14, the upper surface RS1 of the first resin portion 421 may include a convex curved surface between the lowermost end PS1 and the uppermost end PS2. The convex curved surface may be a continuous curved surface or a discontinuous curved surface. The convex curved surface may be convexly disposed in the direction of the light shielding portion 425, and a position of the lowermost end PS1 may be disposed on the front or rear surfaces of the light emitting devices 101 and 103. The upper surface RS1 of the first resin portion 421 may have a flat region A3 on each of the light emitting devices 101 and 103 or include an inclined overlapping region. The lowermost end PS1 of the convex curved surface may be disposed in a region overlapping the upper surfaces of the light emitting devices 101 and 103.

Figure 15:
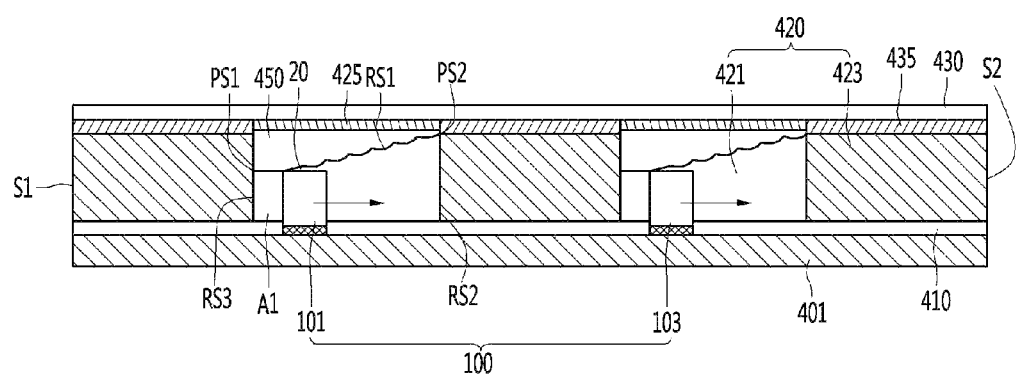

Referring to FIG. 15, the upper surface RS1 of the first resin portion 421 may include a plurality of concave portions and a plurality of convex portions. The upper surface of the first resin portion 421 may be alternately disposed from the lowermost end PS1 to the uppermost end PS2. An interval between the concave portions may be larger than an interval between the convex portions. The concave portion may be a curved surface concave in the direction of the substrate 401, and the convex portion may be a curved surface convex in the direction of the light shielding portion 425, or may be an inflection point between the concave portions. The plurality of concave portions and convex portions reflect incident light, thereby suppressing hot spots. Each of the concave portion and the convex portion may be provided in an elongated shape or a stripe shape in the second direction.

Figure 16:
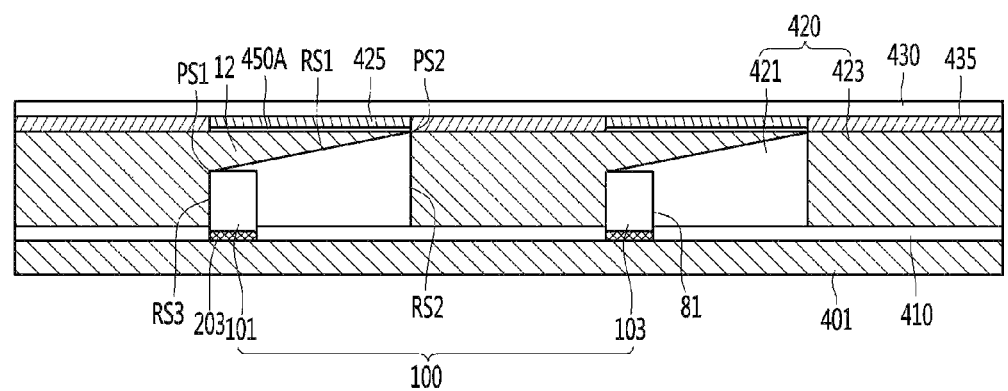

Referring to FIG. 16, the upper surface RS1 of the first resin portion 421 may include an inclined, concave, or/and convex surface. A second extension region 12 may be disposed on the upper surface RS1 of the first resin portion 421. The second extension region 12 may extend from the second resin portion 423 in a direction of a second side surface or a direction of an uppermost end PS2. Since the second extension region 12 is disposed on the first resin portion 421, an area of the air region 450 may be reduced. The second extension region 12 may be disposed between the first resin portion 421 and the light shielding portion 425. The second extension region 12 may be disposed between the air region 450 and the first resin portion 421. Since the second extension region 12 of the second resin portion 423 extends on the light emitting devices 101 and 103, the first adhesive layer 435 is a different area from the upper surface of the first resin portion 421, or an adhesive area may be increased.

Figure 17:
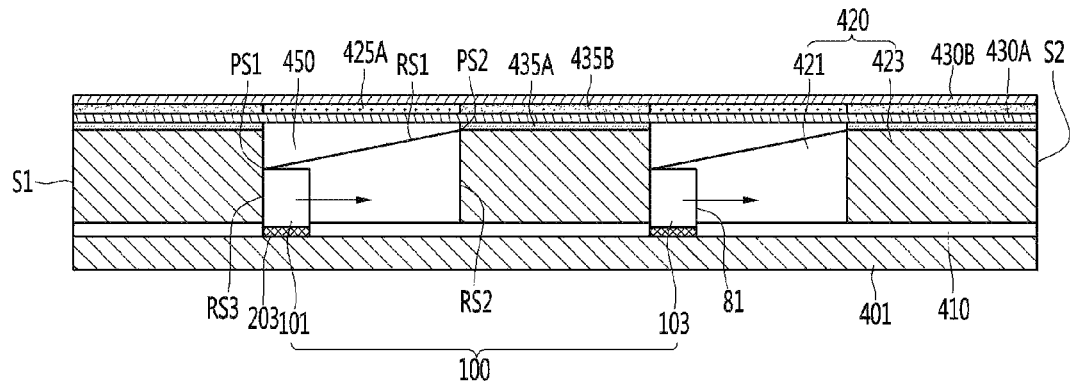
FIG. 17 is a view showing another example of the lighting device according to the first embodiment.

FIG. 17 is another example of the lighting device of FIG. 1. Referring to FIG. 17, the lighting device may include a substrate 401, a light source, a resin layer 420, a first adhesive layer 435A, an air region 450, a first diffusion layer 430A, a second adhesive layer 435B, a light shielding portion 425A and a second diffusion layer 430B. The first diffusion layer 430A may be adhered through the first adhesive layer 435A, and the first adhesive layer 435A may be adhered on the second resin portion 423 of the resin layer 420. The first resin portion 421 may include the embodiment or modified examples disclosed above. The second adhesive layer 435B and the light shielding portion 425A may be disposed between the first diffusion layer 430A and the second diffusion layer 430B. The light shielding portion 425A may overlap the first resin portion 421 in a vertical direction. The light shielding portion 425A may overlap the first resin portion 421 and the air region 450 in a vertical direction. The second adhesive layer 435B may overlap the first adhesive layer 435A and the second resin portion 423 in a vertical direction. Here, the first and second adhesive layers 435A and 435B may include at least one of a UV adhesive, an acryl-based adhesive, and a transparent adhesive. The first diffusion layer 430A may be thinner than the second diffusion layer 430B. The first diffusion layer 430A may be 100 μm or less, and the second diffusion layer 430B may be 100 μm or more. The first and second diffusion layers 430A and 430B may have the same material, and may include, for example, PET material. As another example, the light shielding portion 425A may be disposed on a lower surface of the first diffusion layer 430A. The light shielding portion 425A may be disposed on an upper surface or a lower surface of the first diffusion layer 430A and a lower surface of the second diffusion layer 430B.

FIGS. 18A to 18D are views illustrating a manufacturing process of the lighting device of FIG. 1.

Figure 18A:
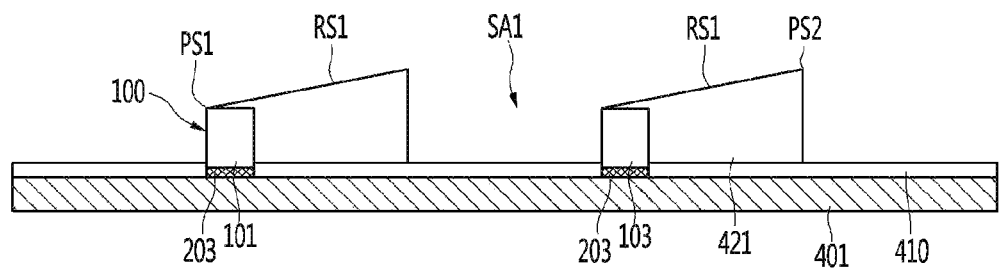
FIGS. 18A to 18D are views illustrating a manufacturing process of the lighting device of FIG. 1.

Referring to FIG. 18A, a reflective member 410 is adhered to a substrate 401, and light emitting devices 101 and 103 of a light source are mounted in an opening of the reflective member 410. Here, the reflective member 410 may be formed after mounting the light emitting devices 101 and 103, but is not limited thereto. A first resin portion 421 is formed on each of the light emitting devices 101 and 103. The first resin portion 421 may cover the emission surfaces, upper surfaces, and respective side surfaces of the light emitting devices 101 and 103. The first resin portion 421 may be disposed to be spaced apart from the emission surface 81 of the light emitting devices 101 and 103. The upper surface RS1 of the first resin portion 421 may be formed as an inclined surface or a concave or convex curved surface from a region in which each of the light emitting devices 101 and 103 is disposed to an uppermost end PS2. The first resin portion 421 may be injection-molded in a structure in which the light emitting devices 101 and 103 are embedded therein. When the first resin portion 421 is molded, it may be cured using a thermal curing method. A region SA1 between the first resin portions 421 is a region in which the second resin portion 423 is to be formed, and the first resin portions 421 arranged in the first direction may be spaced apart from each other. The material of the first resin portion 421 may include a silicone material, a thermosetting resin, or a resin material that does not cause outgassing. The first resin portion 421 is made of a transparent resin material and may contact the exit surfaces of each of the light emitting devices 101 and 103.

Figure 18B:
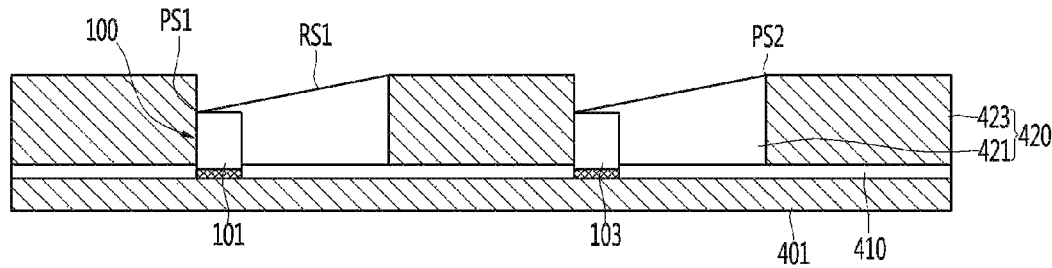

Referring to FIG. 18B, a second resin portion 423 is formed outside the first resin portion 421. The second resin portion 423 may be made of a UV resin material or a resin material that causes outgassing. When the second resin portion 423 is formed, it may be cured using a UV curing method. The second resin portions 423 are disposed between the first resin portions 421, respectively, and may contact outer surfaces of the first resin portions 421. The upper surface of the second resin portion 423 may be disposed at the same height as the uppermost end PS2 of the first resin portion 421, or may be disposed lower or higher. The upper surface of the second resin portion 423 is provided as a flat surface, so that a decrease in adhesive strength may be prevented. The first and second resin portions 421 and 423 may be defined as a resin layer 420.

Figure 18C:
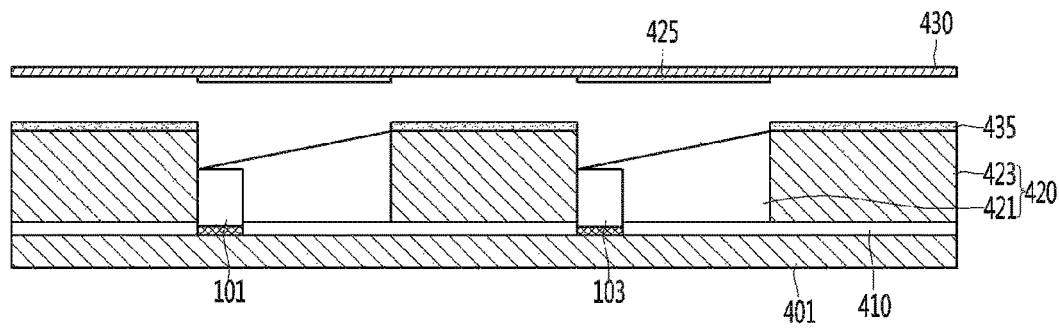

Referring to FIG. 18C, a first adhesive layer 435 may be disposed on an upper surface of the second resin portion 423. The first adhesive layer 435 may be a UV adhesive, an acrylic adhesive, or a transparent adhesive. The first adhesive layer 435 may be spaced apart from the upper surface of the first resin portion 421. As another example, the first adhesive layer 435 may be adhered to a lower surface of the first diffusion layer 430. A first diffusion layer 430 may be disposed on the resin layer 420. The first diffusion layer 430 may be formed of a transparent resin-based or transparent plastic-based material, and may be selected from materials disclosed in the first embodiment. A light shielding portion 425 may be formed on a lower surface of the first diffusion layer 430. The light shielding portion 425 may be disposed on a region corresponding to the first resin portion 421. The light shielding portion 425 may be a region printed with a white material. The light shielding portion 425 may be printed using reflective ink containing any one of $TiO_2$, $Al_2O_3$, $CaCO_3$, $BaSO_4$, and Silicon. The light shielding portion 425 reflects light emitted through the emission surfaces of the light emitting devices 101 and 103 to reduce the occurrence of hot spots on the light emitting devices 101 and 103. The light shielding portion 425 may be formed in a single layer or in multiple layers, and may have the same pattern shape or different pattern shapes.

Figure 18D:
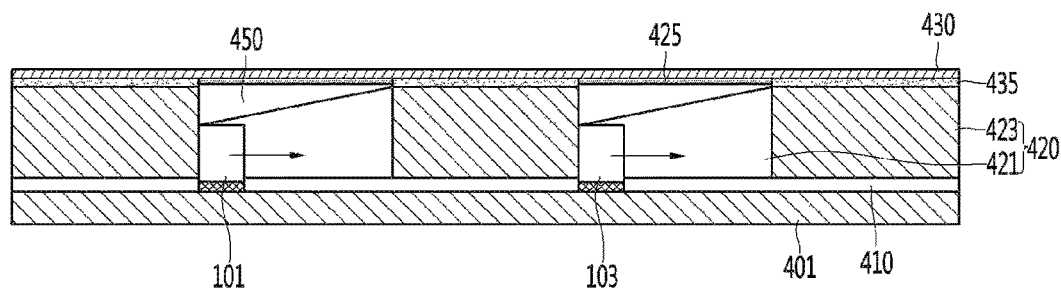

As shown in FIG. 18D, the first diffusion layer 430 may be adhered to the second resin portion 423 of the resin layer 420 by the first adhesive layer 435. In this case, an air region 450 may be disposed between the first resin portion 421 and the first diffusion layer 430. The air region 450 may be the same as or different from the region of the light shielding portion 425. The air region 450 may be the same as or different from the region of the first resin portion 421. The air region 450 may have the same refractive index as air, and may overlap the first resin portion 421 and the light shielding portion 425 in a vertical direction. In the lighting device, after disposing the light emitting devices 101 and 103 on the substrate 401, first and second resin portions 421 and 423 are formed, respectively, and the first resin portion 421 covers the light emitting devices 101 and 103, respectively. By separating the second resin portion 423 from each of the light emitting devices 101 and 103, it is possible to protect the light emitting devices 101 and 103. In addition, the upper surface RS1 of the first resin portion 421 is formed of a a reflective structure, for example, at least one of an inclined surface, a concave curved surface, and/or a convex curved surface, it is possible to reduce hot spots and improve the efficiency of the surface light source.

Figure 19:
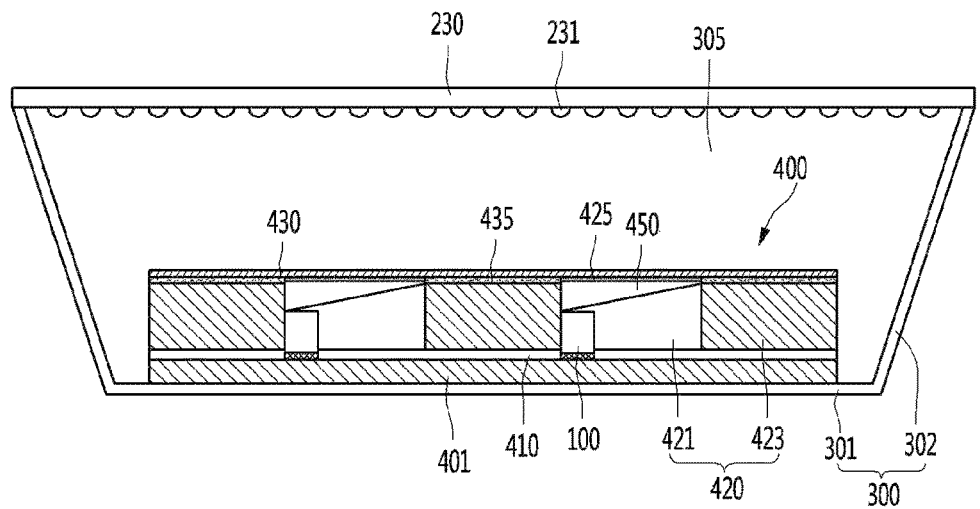
FIG. 19 is an example of the lighting system of FIG. 1.

FIG. 19 is a diagram illustrating a lighting system having a lighting device according to an embodiment. A lighting device in a lighting system according to an embodiment will be described with reference to the above description.

Referring to FIG. 19, the lighting system includes the lighting device 400 disclosed in the embodiment or modified example, for example, and may include a substrate 401, a light source 100 having a plurality of light emitting devices 101 and 103 on the substrate 401, a resin layer 420, a reflective member 410, and a first diffusion layer 430. The resin layer 420 of the lighting device 400 includes first and second resin portions 421 and 423, an air region 450 and a light shielding portion 425 between the first resin portion 421 and the first diffusion layer 430. The second resin portion 423 of the resin layer 420 may be adhered to the first diffusion layer 430 and the first adhesive layer 435. An optical member 230 may be disposed on the lighting device 400, and the optical member 230 may diffuse and transmit incident light. The optical member 230 uniformly diffuses the surface light source emitted through the first diffusion layer 430 to emit light. The optical member 230 may include an optical lens or an inner lens, and the optical lens may condense light in a target direction or change a path of light. The optical member 230 includes a plurality of lens portions 231 on at least one of an upper surface and a lower surface thereof, and the lens portions 231 has a shape protruding downward from the optical member 230 or has a shape protruding upwardly. The optical member 230 may adjust light distribution characteristics of the lighting device. The optical member 230 may include a material having a refractive index of 2.0 or less, for example, a material of 1.7 or less. The material of the optical member 230 may be formed of a transparent resin material such as acrylic, polymethyl methacrylate (PMMA), polycarbonate (PC), or epoxy resin (EP), or transparent glass. The optical member 230 may have a distance of 10 mm or more, such as 15 mm to 100 mm, with the lighting device, for example, the substrate 401, and when the distance is out of the above range, the luminous intensity may be reduced, and the range when the distance is smaller than the above range, the uniformity of light may be lowered. The lighting device may include a heat radiation plate (not shown) on a bottom surface. The heat dissipation plate may include a plurality of heat dissipation fins, and may dissipate heat conducted to the substrate 401. The heat dissipation plate may include at least one of metals such as aluminum, copper, magnesium, and nickel, or a selective alloy thereof. The lighting device includes a housing 300 having a receiving space 305, a lighting device and an optical member 230 disposed on the lighting device according to an embodiment disposed on the bottom of the receiving space 305 of the housing 300. In the housing 300, an outer surface of the receiving space 305 may be provided as an inclined surface with respect to the bottom surface of the housing 300, and such an inclined surface may improve light extraction efficiency. The surface of the receiving space 305 of the housing 300 may be formed of a metallic material of a reflective material, and light extraction efficiency in the receiving space 305 may be improved by the metallic material. The depth of the receiving space 305 may be disposed larger than the high point of the resin layer 420, and light emitted through the resin layer 420 may be emitted. The housing 300 includes a bottom portion 301 and a reflection portion 302, the bottom portion 301 is disposed under the substrate 401, the reflection portion 302 protrudes upward from the outer periphery of the bottom portion 301 and may be disposed around the resin layer 420. The housing 300 may include a metal or plastic material, but is not limited thereto. An opening (not shown) through which a cable connected to the substrate 401 passes may be formed in the bottom portion 301 or the reflective portion 302 of the housing 300, but the embodiment is not limited thereto. The substrate 401 may be adhered to the bottom 301 of the housing 300 with a fastening means such as a screw or an adhesive member, or may be coupled to a structure such as a hook. Accordingly, the substrate 401 may be fixed to the bottom of the housing 300. The lighting device according to the embodiment may apply various vehicle lighting devices such as a head lamp, a vehicle width light, a side mirror light, a fog light, a tail lamp, a stop lamp, and a daytime running light, a display device, and a traffic light.

FIG. 20 is a front view showing a light emitting device on a substrate in the lighting device according to the embodiment, and FIG. 21 is a side view of the light emitting device of FIG. 20. Referring to FIGS. 20 and 21, the light emitting devices 101 and 103 include a body 10 having a cavity 20, a plurality of frames 30 and 40 in the cavity 20, and a light emitting diode chip 71 disposed on at least one of the plurality of frames 30 and 40. These light emitting devices 101 and 103 may be implemented as a side-emitting type package. The body 10 may include a cavity 20 in which the frames 30 and 40 are exposed at the bottom. The plurality of frames 30 and 40 are separated into, for example, a first frame 30 and a second frame 40 and are coupled to the body 10. The body 10 may be formed of an insulating material. The body 10 may be formed of a reflective material. The body 10 may be formed of a material having a reflectance higher than transmittance, for example, a material having a reflectance of 70% or more with respect to the wavelength emitted from the light emitting diode chip. When the reflectance of the body 10 is 70% or more, the body 10 may be defined as a non-transmissive material or a reflective material. The body 10 may be formed of a resin-based insulating material, for example, a resin material such as Polyphthalamide (PPA). The body 10 may be formed of a silicone-based, epoxy-based, or thermosetting resin including a plastic material, or a material having high heat resistance and high light resistance. The first frame 30 includes a first lead portion 31 disposed on the bottom of the cavity 20, and a first bonding portion 32 and a first heat dissipating portion 33 extending outside the body 10. The first bonding portion 32 may be bent from the first lead portion 31 in the body 10 and protrudes outside the body, and the first heat dissipating portion 33 may be bent from the first bonding portion 32. The second frame 40 includes a second lead portion 41 disposed at the bottom of the cavity 20, a second bonding portion 42 and a second heat dissipating portion 43 disposed outside the body 10. The second bonding portion 42 may be bent from the second lead portion 41 in the body 10, and the second heat dissipating portion 43 may be bent from the second bonding portion 42.

Here, the LED chip 71 may be disposed on the first lead portion 31 of the first frame 30, for example, and connected to the first and second lead portions 31 and 41 by wire, or may be connected with an adhesive to the first lead portion 31 and may be connected with a wire to the second lead portion 41. The LED chip 71 may be a horizontal chip, a vertical chip, or a chip having a via structure. The LED chip 71 may be mounted in a flip chip method. The LED chip 71 may selectively emit light within a wavelength range of ultraviolet to visible light. The LED chip 71 may emit blue, green, or red peak wavelength, for example. The LED chip 71 may include at least one of a group II-VI compounds and a group III-V compounds. The LED chip 71 may be formed of, for example, a compound selected from the group consisting of GaN, AlGaN, InGaN, AlInGaN, GaP, AlN, GaAs, AlGaAs, InP, and mixtures thereof. One or more LED chips 71 may be disposed in the cavity 20 and emit light having the greatest intensity in the direction of the central axis Y0. One or a plurality of LED chips disposed in the cavity 20 of the light emitting devices 101 and 103 according to the embodiment may be disposed. The light emitting diode chip may be selected from, for example, a red LED chip, a blue LED chip, a green LED chip, and a yellow green LED chip.

A molding member 80 is disposed in the cavity 20 of the body 11, and the molding member 80 includes a light-transmitting resin such as silicone or epoxy, and may be formed in a single layer or multiple layers. A means for changing the wavelength of light emitted on the molding member 80 or the LED chip 71 may be included, and the wavelength conversion means includes a quantum dot or a phosphor, and excites a part of the light emitted from the LED chip 71 to emit light of a different wavelength. The phosphor may be selectively formed from quantum dots, YAG, TAG, Silicate, Nitride, and Oxy-nitride-based materials. The phosphor may include at least one of a red phosphor, a yellow phosphor, and a green phosphor, but is not limited thereto. The emission surface 81 of the molding member 80 may be formed in a flat shape, a concave shape, a convex shape, and the like, but is not limited thereto. As another example, a light-transmitting film having a phosphor may be disposed on the cavity 20, but the embodiment is not limited thereto. A lens may be further formed on the upper portion of the body 10, and the lens may have a concave or/and convex lens structure, and may control light distribution of light emitted by the light emitting devices 101 and 103. A semiconductor device such as a light-receiving device and a protection device may be mounted on the body 10 or any one frame, and the protection device may be implemented as a thyristor, a Zener diode, or a TVS (transient voltage suppression). The Zener diode protects the LED chip from electrostatic discharge (ESD). At least one or a plurality of light emitting devices 101 and 103 are disposed on the substrate 401, and a reflective member 410 is disposed around the lower periphery of the light emitting devices 101 and 103. The first and second lead portions 33 and 43 of the light emitting devices 101 and 103 are bonded to the pads 403 and 405 of the substrate 401 with solder or conductive tape, which are conductive adhesive members 203 and 205.

The lighting device according to the invention may be applied to various lamp devices that require lighting, such as vehicle lamps, home lighting devices, and industrial lighting devices. For example, when applied to vehicle lamps, it is applicable to headlamps, sidelights, side mirrors, fog lights, tail lamps, brake lights, daytime running lights, vehicle interior lights, door scars, rear combination lamps, backup lamps, etc. The lighting device of the invention may be applied to indoor and outdoor advertising devices, display devices, and various electric vehicle fields, and in addition, it may be applied to all lighting-related fields or advertisement-related fields that have been developed and commercialized or may be implemented according to future technological development.

The invention claimed is:

1. A lighting device comprising:
a substrate;
a light source including a plurality of light emitting devices disposed on the substrate;
a resin layer disposed on the substrate; and
a first diffusion layer disposed on the resin layer,
wherein the resin layer includes a first resin portion disposed on the light source and the substrate, and a second resin portion adjacent to the first resin portion and disposed on the substrate,
wherein an upper surface of the first resin portion has an inclination from a lower end to an upper end and is spaced apart from the first diffusion layer,
wherein the second resin portion includes a material different from that of the first resin portion, and
wherein a height of an upper surface of the second resin portion is higher than a height of a lowermost end of the upper surface of the first resin portion with respect to an upper surface of the substrate,
the lighting device further comprising:
a light shielding portion disposed on the first resin portion, wherein the upper surface of the second resin portion does not overlap the light shielding portion in a vertical direction,
an air region portion disposed between the first resin portion and the first diffusion layer,
wherein the air region portion and the light shielding portion overlap the first resin portion in the vertical direction, and,
wherein the air region portion has different gap heights between the upper surface of the first resin portion and the first diffusion layer.

2. The lighting device of claim 1, wherein the light source comprises at least one first light emitting device and at least one second light emitting device spaced apart from the first light emitting device,
wherein the second resin portion is disposed between the first light emitting device and the second light emitting device,
wherein a plurality of the first resin portions is disposed, and the second resin portion is disposed between the plurality of first resin portions.

3. The lighting device of claim 2, comprising a reflective member disposed between the resin layer and the substrate,
wherein each of the plurality of first resin portions covers at least one first light emitting device, and wherein the reflective member is disposed between the first resin portions and the substrate and between the second resin portion and the substrate.

4. The lighting device of claim 1, wherein the light emitting devices are arranged in N rows and M columns on the substrate, and the M and the N are integers of 1 or more, and have a relationship of N≥M, and
wherein the first resin portion and the second resin portion are alternately arranged in a row direction.

5. The lighting device of claim 4, wherein the first resin portions are spaced apart from each other in a column direction or integrally formed along the row direction.

6. The lighting device of claim 5, wherein the resin layer comprises a first side surface and a second side surface disposed opposite to each other,
wherein the first light emitting device is adjacent to the first side surface,
wherein the second light emitting device is adjacent to the second side surface,
wherein the second resin portion is disposed between the first light emitting device adjacent to the first side surface of the resin layer and the second light emitting device adjacent to the second side surface.

7. The lighting device of claim 1, comprising a first adhesive layer for bonding the second resin portion and the first diffusion layer,
wherein a height of an uppermost end of the second resin portion is equal to or higher than a height of an uppermost end of the upper surface of the first resin portion.

8. The lighting device of claim 1, further comprising a second diffusion layer disposed on the first diffusion layer; and a second adhesive layer disposed between the first diffusion layer and the second diffusion layer,
wherein the light shielding portion is disposed between the first diffusion layer and the second diffusion layer and overlaps, in the vertical direction, an area of the first resin portion between the light source and the second resin portion, and
wherein the second adhesive layer and the first adhesive layer overlap in the vertical direction.

9. The lighting device of claim 1, wherein the first adhesive layer does not overlap in the vertical direction to the first resin portion.

10. The lighting device of claim 1, wherein the first resin portion and the second resin portion are alternately arranged,
wherein the first resin portion includes a silicone resin or a thermosetting resin,
wherein the second resin portion includes a UV resin.

11. A lighting device comprising:
a substrate;
a light source disposed on the substrate;
a resin layer disposed on the substrate; and
a first diffusion layer disposed on the resin layer,
wherein the light source includes a first light emitting device and a second light emitting device spaced apart from the first light emitting device,
wherein the resin layer includes a plurality of first resin portions disposed on the first light emitting device and the second light emitting device, and a plurality of second resin portions disposed between the first light emitting device and the second light emitting device,
wherein the plurality of first resin portions overlaps the light source in a vertical direction,
wherein upper surface of each of the plurality of first resin portions is spaced apart from the first diffusion layer at different intervals,
wherein a height of an upper surface of each of the second resin portions with respect to an upper surface of the substrate is higher than a height of the upper surface of each of the first resin portions overlapping with the first light emitting device in the vertical direction on the upper surface of the substrate,
the lighting device further comprising:
a plurality of light shielding portions disposed on each of the first resin portions, wherein the upper surface of each of the second resin portions does not overlap each of the light shielding portions in a vertical direction, and
a plurality of air region portions disposed between each of the first resin portions and the first diffusion layer,
wherein each of the plurality of air region portions and each of the plurality of light shielding portions overlap each of the first resin portions in the vertical direction,
wherein each of the plurality of air region portions has different gap heights between the upper surface of each of the first resin portions and the first diffusion layer.

12. The lighting device of claim 11, wherein a height of an uppermost end of each of the second resin portions is higher than or equal to a height of an uppermost end of the upper surface of each of the first resin portions.

13. The lighting device of claim 11, wherein each of the second resin portions and the first diffusion layer are bonded to each other by a first adhesive layer.

14. The lighting device of claim 13, wherein the first adhesive layer does not overlap in the vertical direction to the plurality of first resin portions.

15. The lighting device of claim 11, further comprising a second diffusion layer disposed on the first diffusion layer; and a second adhesive layer disposed between the first diffusion layer and the second diffusion layer,
wherein each of the light shielding portions is disposed between the first diffusion layer and the second diffusion layer, and overlaps a corresponding area of the first resin portion between the light source and the second resin portion in the vertical direction, and
wherein the second adhesive layer and the first adhesive layer overlap in the vertical direction.

16. The lighting device of claim 11, wherein the plurality of first resin portions is disposed to be spaced apart from each other, and the second resin portions disposed between the first resin portions are connected to each other,
wherein the first resin portions include a silicone resin or a thermosetting resin,
wherein the second resin portions include a UV resin.

17. The lighting device of claim 11, wherein horizontal lengths of each of the second resin portions and each of the first resin portions disposed between the first light emitting device and the second light emitting device are in a ratio of 4:6 to 6:4.

18. The lighting device of claim 11, further comprising a reflective member disposed between the resin layer and the substrate,
wherein the reflective member is disposed between the plurality of first resin portions and the substrate and between the plurality of second resin portions and the substrate,
wherein each of the plurality of first resin portions has an inclined upper surface.

* * * * *